US012501618B2

(12) United States Patent
Kang et al.

(10) Patent No.: US 12,501,618 B2
(45) Date of Patent: Dec. 16, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Sangmin Kang, Suwon-si (KR); Bio Kim, Suwon-si (KR); Kyungwook Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 383 days.

(21) Appl. No.: 18/062,251

(22) Filed: Dec. 6, 2022

(65) Prior Publication Data

US 2023/0328985 A1 Oct. 12, 2023

(30) Foreign Application Priority Data

Apr. 11, 2022 (KR) .......................... 10-2022-0044591

(51) Int. Cl.
*H10B 43/27* (2023.01)
*G11C 5/06* (2006.01)
(Continued)

(52) U.S. Cl.
CPC ............... *H10B 43/27* (2023.02); *G11C 5/06* (2013.01); *H01L 23/5226* (2013.01);
(Continued)

(58) Field of Classification Search
CPC ........ H10B 43/27; H10B 43/35; H10B 43/40; H10B 43/10; H10B 41/10; H10B 41/35;
(Continued)

(56) References Cited

U.S. PATENT DOCUMENTS

| 6,455,882 B1 * | 9/2002 | Nakura ............. H01L 21/02197 257/532 |
| 10,290,645 B2 | 5/2019 | Nakatsuji et al. |

(Continued)

FOREIGN PATENT DOCUMENTS

| EP | 3492533 A1 | 6/2019 |
| JP | 2022032042 A | 2/2022 |

(Continued)

OTHER PUBLICATIONS

Extended European Search Report for EP Application No. 23160776.3 mailed Sep. 8, 2023, 9 pages.

*Primary Examiner* — Tu-Tu V Ho
(74) *Attorney, Agent, or Firm* — Wolf, Greenfield & Sacks, P.C.

(57) ABSTRACT

A semiconductor device includes a peripheral circuit structure including: a first substrate, circuit devices on the first substrate, a lower wiring structure electrically connected to the circuit devices, a lower insulating layer covering the lower wiring structure, and a diffusion barrier layer on the lower insulating layer; and a memory cell structure including a second substrate including first and second regions on the peripheral circuit structure, gate electrodes stacked and spaced apart from each other in a first direction perpendicular to an upper surface of the second substrate in the first region and extending in a second direction perpendicular to the first direction to form a staircase shape in the second region, and channel structures penetrating the gate electrodes in the first direction and each including a channel layer. The diffusion barrier layer includes a first material layer having a hydrogen permeability lower than a hydrogen permeability of silicon nitride.

20 Claims, 19 Drawing Sheets

(51) Int. Cl.
  *H01L 23/522*  (2006.01)
  *H01L 23/528*  (2006.01)
  *H10B 41/10*  (2023.01)
  *H10B 41/27*  (2023.01)
  *H10B 41/35*  (2023.01)
  *H10B 41/40*  (2023.01)
  *H10B 43/10*  (2023.01)
  *H10B 43/35*  (2023.01)
  *H10B 43/40*  (2023.01)

(52) U.S. Cl.
  CPC ......... *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
  CPC .......... H10B 41/40; H10B 41/27; G11C 5/06; H01L 23/5226; H01L 23/5283
  USPC ....................................................... 257/314
  See application file for complete search history.

(56) References Cited

U.S. PATENT DOCUMENTS

| | | |
|---|---|---|
| 10,811,604 B2 | 10/2020 | Lee et al. |
| 11,133,297 B2 | 9/2021 | Kim et al. |
| 11,152,277 B2 | 10/2021 | Liu |
| 2020/0312775 A1 | 10/2020 | Lee et al. |
| 2021/0288068 A1 | 9/2021 | Kim et al. |
| 2022/0045083 A1 | 2/2022 | Sim et al. |
| 2022/0085025 A1* | 3/2022 | Lim ................... H10B 12/0335 |
| 2022/0109004 A1* | 4/2022 | Lim ...................... H10B 41/35 |
| 2023/0164995 A1* | 5/2023 | Yamashita ............. H10B 41/27 257/314 |

FOREIGN PATENT DOCUMENTS

| | | |
|---|---|---|
| KR | 10-2006-0043171 A | 5/2006 |
| KR | 20190045636 A | 5/2019 |
| KR | 10-2020-0038323 A | 4/2020 |
| KR | 10-2021-0032920 A | 3/2021 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2022-0044591, filed on Apr. 11, 2022 in the Korean Intellectual Property Office, the disclosure of which is incorporated herein by reference in its entirety.

BACKGROUND

Example embodiments of the present disclosure relate to a semiconductor device and a data storage system including the same.

A semiconductor device storing high-capacity data in a data storage system requiring data storage has been necessary. Accordingly, a method for increasing data storage capacity of a semiconductor device has been studied. For example, as one of the methods for increasing data storage capacity of a semiconductor device, a semiconductor device including memory cells arranged three-dimensionally, instead of memory cells arranged two-dimensionally, has been suggested.

SUMMARY

Example embodiments of the present disclosure include a semiconductor device having improved productivity and improved electrical properties and a data storage system including the same.

According to an example embodiment of the present disclosure, a semiconductor device includes: a peripheral circuit structure including a first substrate, circuit devices on the first substrate, a lower wiring structure electrically connected to the circuit devices, a lower insulating layer covering the lower wiring structure, and a diffusion barrier layer on the lower insulating layer; and a memory cell structure including a second substrate including first and second regions on the peripheral circuit structure, gate electrodes stacked and spaced apart from each other in a first direction perpendicular to an upper surface of the second substrate in the first region and extending in a second direction perpendicular to the first direction to form a staircase shape in the second region, and channel structures penetrating the gate electrodes in the first direction and each including a channel layer, wherein the diffusion barrier layer includes a first material layer having a hydrogen permeability lower than a hydrogen permeability of silicon nitride.

According to an example embodiment of the present disclosure, a semiconductor device includes: a first substrate; circuit devices on the first substrate; a lower wiring structure electrically connected to the circuit devices; a first lower insulating layer covering a side surface of the lower wiring structure; a buffer layer covering the first lower insulating layer and the lower wiring structure; a second lower insulating layer on the buffer layer; a diffusion barrier layer on the second lower insulating layer; a second substrate including first and second regions on the diffusion barrier layer; gate electrodes stacked and spaced apart from each other in a first direction perpendicular to an upper surface of the second substrate in the first region and extending in a second direction perpendicular to the first direction at various lengths to form a staircase shape in the second region; and channel structures penetrating the gate electrodes in the first direction and each including a channel layer, wherein the diffusion barrier layer includes a first material layer which is a two-dimensional material layer.

According to an example embodiment of the present disclosure, a data storage system includes a semiconductor storage device including: a peripheral circuit structure including a first substrate, circuit devices on the first substrate, a lower wiring structure electrically connected to the circuit devices, a lower insulating layer covering the lower wiring structure, and a diffusion barrier layer on the lower insulating layer; and a memory cell structure including a second substrate including first and second regions on the peripheral circuit structure, gate electrodes stacked and spaced apart from each other in a first direction perpendicular to an upper surface of the second substrate in the first region and extending in a second direction perpendicular to the first direction a staircase shape in the second region, and channel structures penetrating the gate electrodes in the first direction and each including a channel layer, and an input/output pad electrically connected to the circuit devices; and a controller electrically connected to the semiconductor storage device through the input/output pad and configured to control the semiconductor storage device, wherein the diffusion barrier layer includes a first material layer having a hydrogen permeability lower than a hydrogen permeability of silicon nitride.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
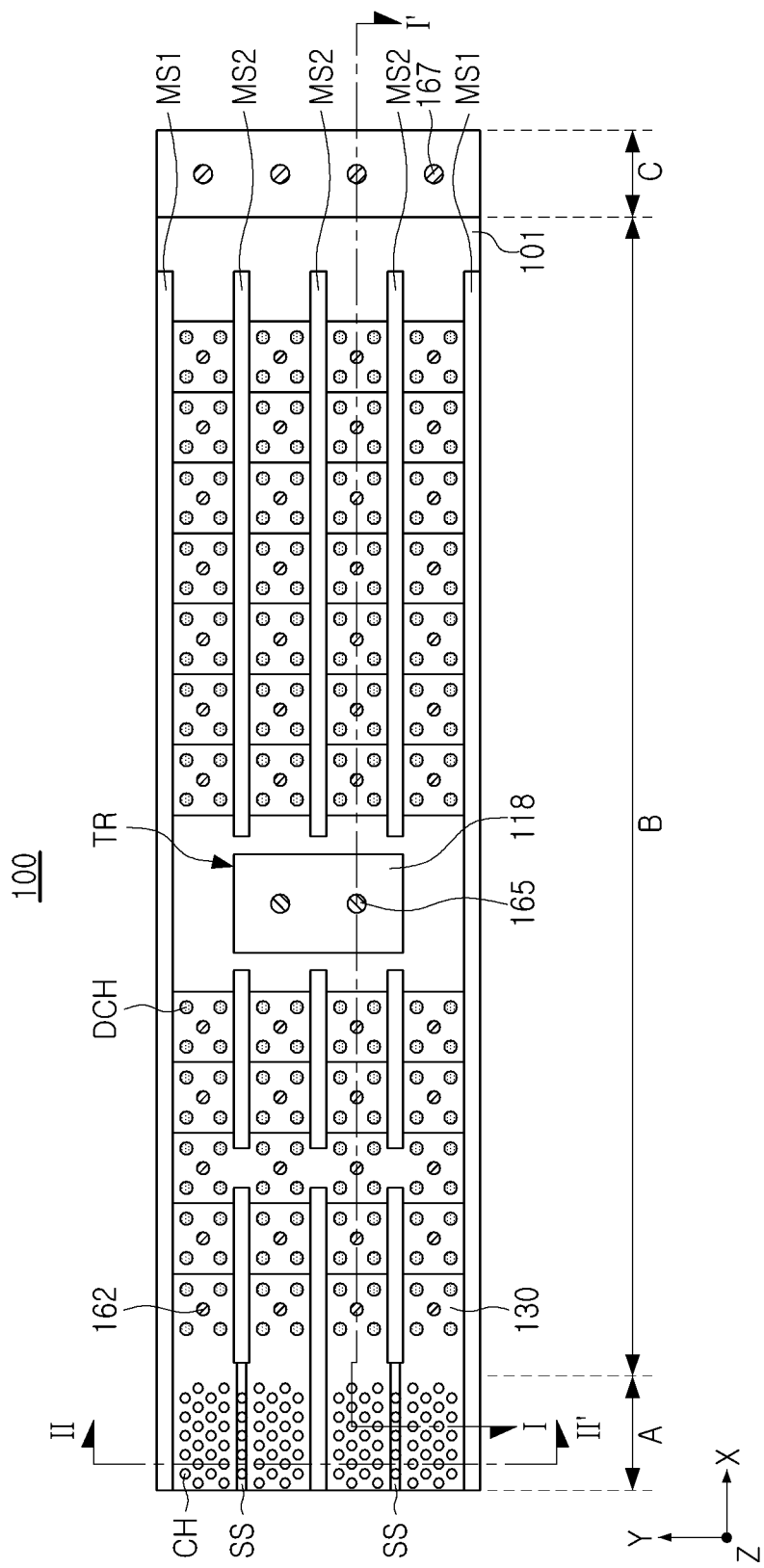
FIG. 1 is a plan diagram illustrating a semiconductor device according to an example embodiment of the present disclosure.

FIG. 1 is a plan diagram illustrating a semiconductor device according to an example embodiment.

Figure 2A:
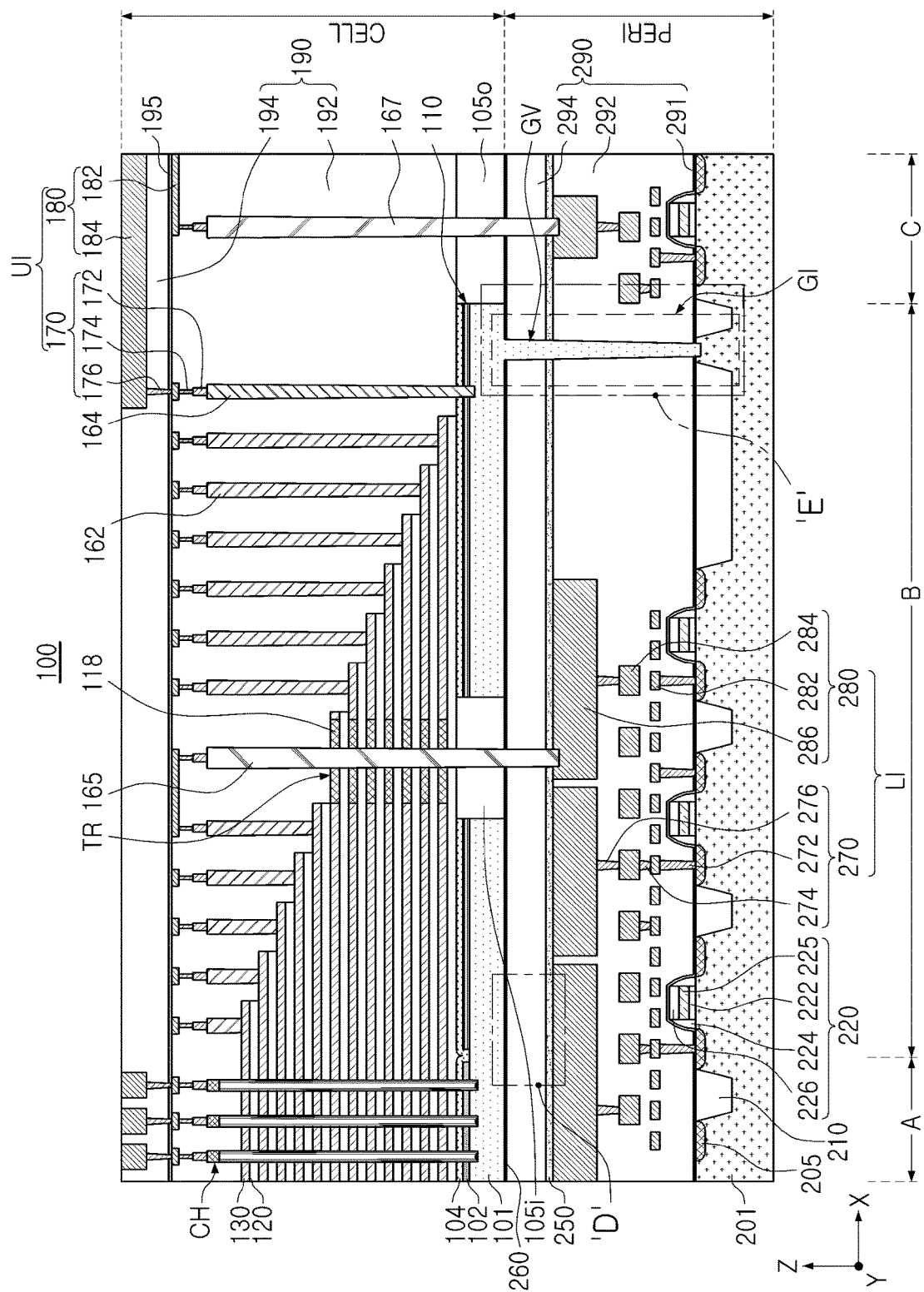
FIGS. 2A and 2B are cross-sectional diagrams illustrating a semiconductor device according to an example embodiment of the present disclosure.
Figure 2B:
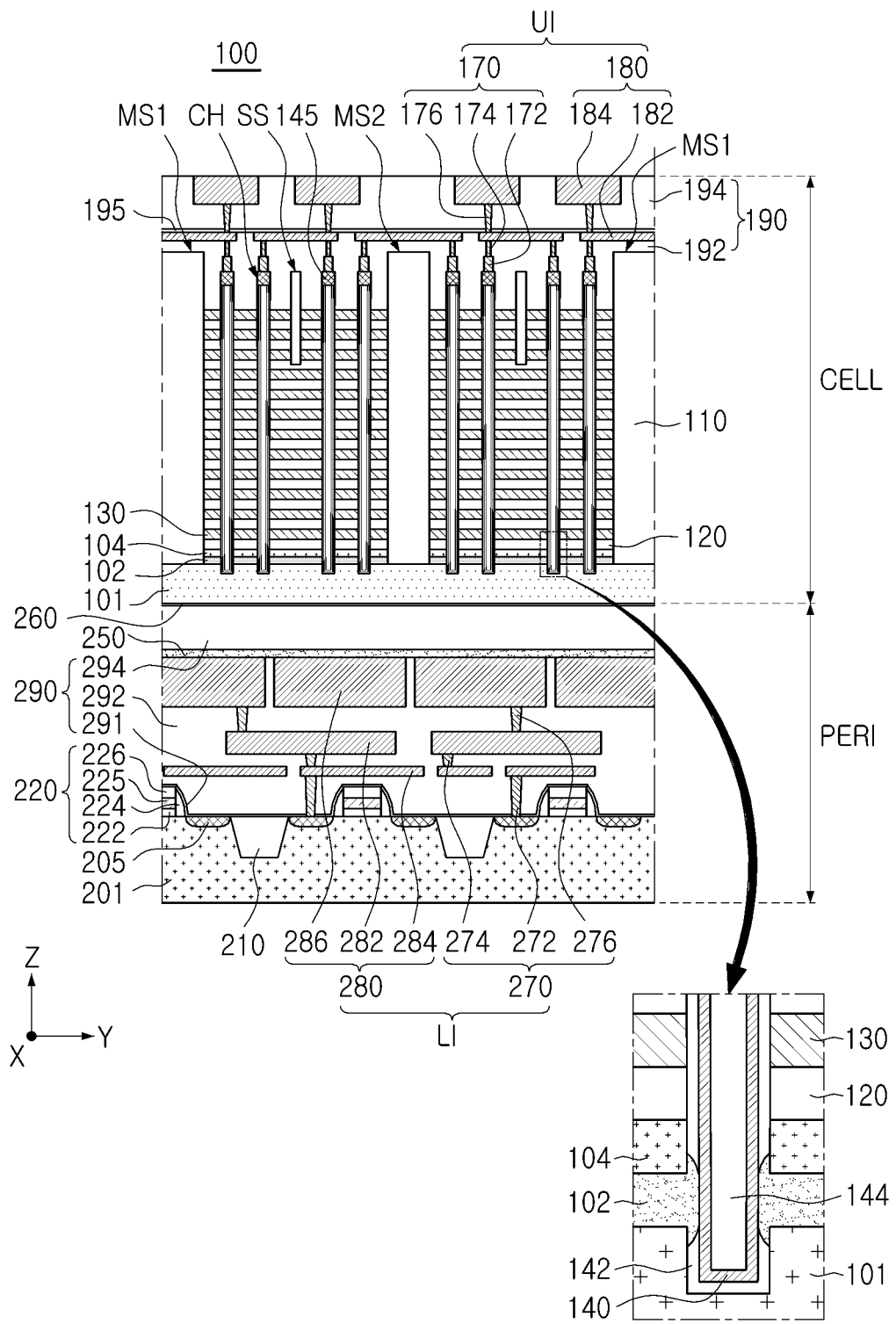

FIGS. 2A and 2B are cross-sectional diagrams illustrating a semiconductor device according to an example embodiment. FIG. 2A illustrates a cross-sectional diagram taken along line I-I' in FIG. 1, and FIG. 2B illustrates a cross-sectional diagram taken along line II-IF in FIG. 1.

Figure 3A:
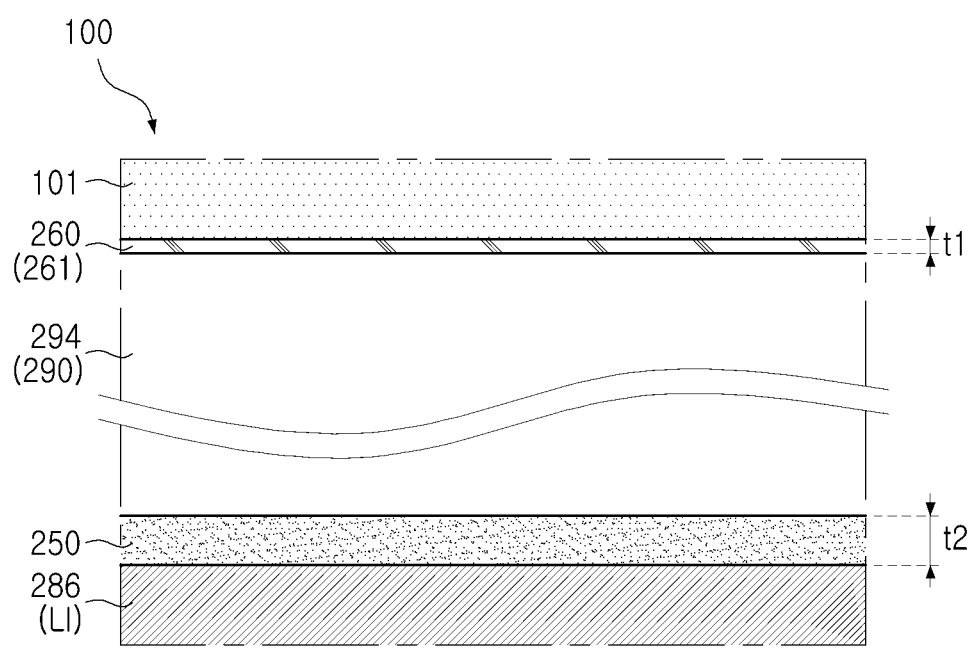
FIGS. 3A and 3B are enlarged diagrams illustrating a portion of a semiconductor device according to an example embodiment of the present disclosure.
Figure 3B:
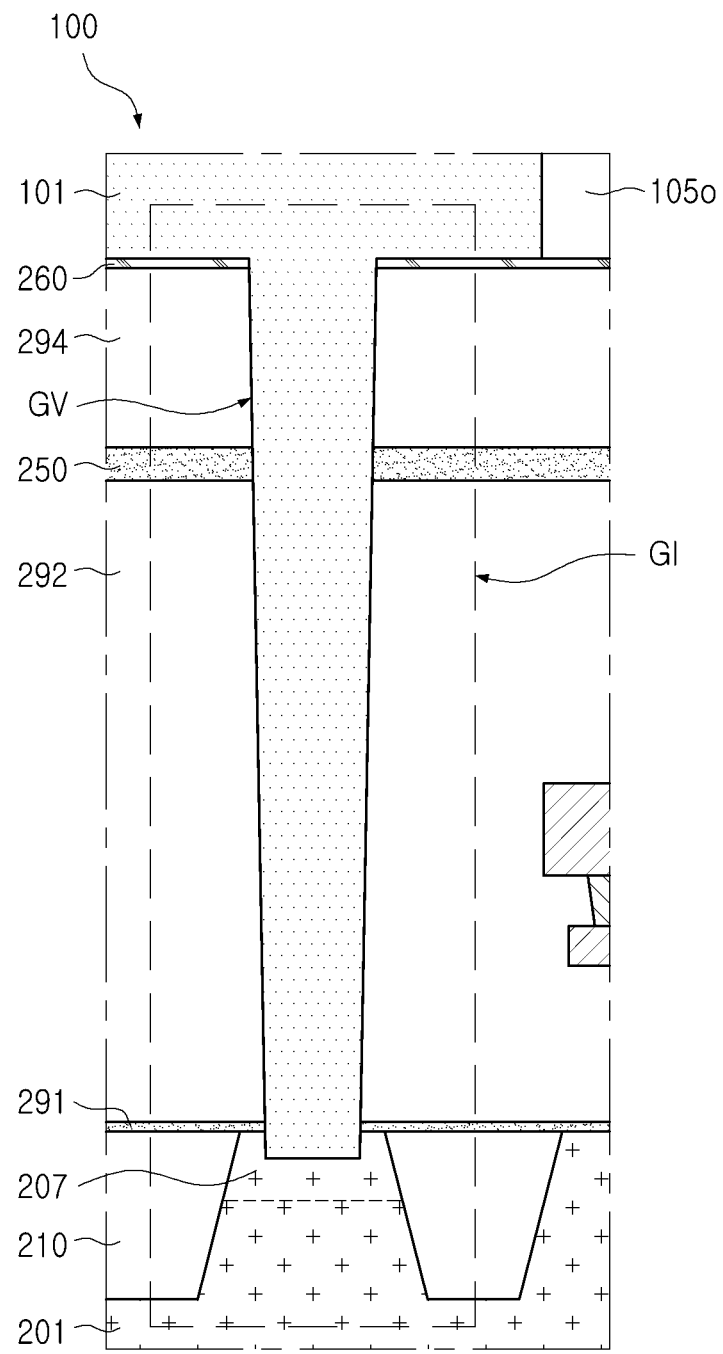

FIGS. 3A and 3B are enlarged diagrams illustrating a portion of a semiconductor device according to an example embodiment. FIG. 3A is an enlarged diagram illustrating region "D" in FIG. 2A, and FIG. 3B is an enlarged diagram illustrating region "E" in FIG. 2A.

Referring to FIGS. 1 to 3B, a semiconductor device 100 may include a peripheral circuit structure PERI including a first substrate 201 and a memory cell structure CELL including a second substrate 101. The memory cell structure CELL may be disposed on the peripheral circuit PERI. Alternately, in example embodiments, the memory cell structure CELL may be disposed below the peripheral circuit structure PERI.

In an example embodiment, the semiconductor device 100 may further include a through-wiring region TR electrically connecting the peripheral circuit structure PERI to the memory cell structure CELL, and a ground wiring structure GI connecting the first substrate 201 and the second substrate 101.

The peripheral circuit structure PERI may include a first substrate 201, source/drain regions 205 and device isolation layers 210 in the first substrate 201, circuit devices 220 disposed on the first substrate 201, a lower wiring structure LI, a lower insulating layer 290 covering the lower wiring structure LI, a buffer layer 250, and a diffusion barrier layer 260.

The first substrate 201 may have an upper surface extending in the x direction and the y direction. The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

An active region may be defined in the first substrate 201 by the device isolation layers 210. The device isolation layers 210 may be formed as shallow trench isolation films. The source/drain regions 205 may be regions including impurities in a portion of the active region. The source/drain regions 205 may be spaced apart from each other in the active region.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

In an example embodiment, each of the circuit devices 220 may further include a circuit gate capping layer on the circuit gate electrode 225. The circuit gate capping layer 226 may include a material such as silicon nitride.

The lower wiring structure LI may be configured as a wiring structure electrically connected to the circuit devices 220 and the source/drain regions 205. The lower wiring structure LI may include lower contact plugs 270 and lower wiring lines 280 configured in the form of lines. The lower contact plugs 270 may include first to third lower contact plugs 272, 274, and 276. The lower wiring lines 280 may include first to third lower wiring lines 282, 284, and 286. The first lower contact plugs 272 may be disposed on the circuit devices 220 and the source/drain regions 205, the second lower contact plugs 274 may be disposed on the first lower wiring lines 282, and the third lower contact plugs 276 may be disposed on the second lower wiring lines 284. The first lower wiring lines 282 may be disposed on the first lower contact plugs 272, the second lower wiring lines 284 may be disposed on the second lower contact plugs 274, and the third lower wiring lines 286 may be disposed on the third lower contact plugs 276. The lower wiring structure LI may include a conductive material, such as, for example, tungsten (W), copper (Cu), aluminum (Al), or the like, and each of the components may further include a diffusion barrier layer. However, in example embodiments, the number of the lower contact plugs 270 and the lower wiring lines 280 included in the lower wiring structure LI and the arrangement thereof may be varied.

In an example embodiment, each of the lower wiring lines 280 and the lower contact plugs 270 may have a damascene structure formed by a dual damascene process of simultaneously forming a wiring line portion and a contact plug portion. Here, the damascene process may include forming an insulating layer, forming an opening in the insulating layer, and forming a connection pattern in the opening. However, in example embodiments, at least a portion of the lower wiring lines 280 and the lower contact plugs 270 may have a single damascene structure in which a wiring line portion and a contact plug portion may be formed by a single damascene process.

The lower insulating layer 290 may be disposed on the circuit devices 220 on the first substrate 201. The lower insulating layer 290 may include an insulating liner 291, a first lower insulating layer 292, and a second lower insulating layer 294. The insulating liner 291 may conformally cover the first substrate 201 and the circuit devices 220. The insulating liner 291 may include, for example, silicon nitride. The first lower insulating layer 292 may cover the insulating liner 291 and may include a plurality of insulating layers. The first lower insulating layer 292 may cover the side surface of the lower wiring structure LI and the first lower insulating layer 292 may have an upper surface coplanar with an upper surface of the lower wiring structure LI. The second lower insulating layer 294 may be disposed on the first lower insulating layer 292 and may include a plurality of insulating layers. The first and second lower insulating layers 292 and 294 may include, for example, silicon oxide. In the example embodiments, the first and second lower insulating layers 292 and 294 may be referred to as lower insulating layers.

The buffer layer 250 may be disposed between the lower wiring structure LI and the second lower insulating layer 294 and between the first lower insulating layer 292 and the second lower insulating layer 294. The buffer layer 250 may be conformally disposed along the upper surface of the lower wiring structure LI and the upper surface of the first lower insulating layer 292. In an example embodiment, the buffer layer 250 may work as a capping layer for forming electrodes on the front wiring structure LI connected to the front wiring structure LI, and may work as a diffusion barrier auxiliary layer assisting the diffusion barrier layer 260 disposed on the buffer layer 250 in example embodiments. The buffer layer 250 may include an insulating material, such as, for example, silicon nitride.

The diffusion barrier layer 260 may be disposed on the second lower insulating layer 294 and may be spaced apart from the lower wiring structure LI by the second lower insulating layer 294 and the buffer layer 250. The diffusion barrier layer 260 may be disposed on a vertical level higher than a level of the buffer layer 250. The diffusion barrier layer 260 may be disposed between the second lower insulating layer 294 and the second substrate 101 of the memory cell structure CELL. The diffusion barrier layer 260 may conformally cover the upper surface of the second lower insulating layer 294.

The diffusion barrier layer 260 may include a material having a hydrogen permeability lower than a hydrogen permeability of the buffer layer 250. In an example embodiment, the diffusion barrier layer 260 may include a first material layer 261 having a hydrogen permeability lower than a hydrogen permeability of silicon nitride. The hydrogen permeability of silicon nitride may be about $7.4 \times 10^{12}/m^2$ s (at 1 nm, 1 bar), and the hydrogen permeability of the first material layer 261 may be less than about $7.4 \times 10^{12}/m^2$ s (at 1 nm, 1 bar).

The first material layer 261 may include a two-dimensional material, polycrystalline silicon, or metal oxide. The two-dimensional material may include graphene, hexagonal boron nitride (h-BN), black phosphorus, or transition metal di-chalcogenide (TMDC). When the first material layer 261 is, for example, graphene, the hydrogen permeability of the first material layer 261 may be about $1.0 \times 10^{10}/m^2$ s (at 1 nm, 1 bar).

In an example embodiment, when the first material layer 261 is a two-dimensional material layer, the first material layer 261 may have a multilayer form in which one type of two-dimensional material is stacked in a plurality of layers. However, in example embodiments, the first material layer 261 may have a heterostructure in which at least two types of two-dimensional materials are stacked in a plurality of layers. That is, when the first material layer 261 has a heterostructure, the first material layer 261 may include two or more two-dimensional materials.

A first thickness t1 of the diffusion barrier layer 260 according to the example embodiments may refer to the thickness of the first material layer 261. In an example, the first thickness t1 of the diffusion barrier layer 260 may be in the range of about 1 Å to about 500 Å, for example, and in another example, the first thickness t1 of the diffusion barrier layer 260 may be in the range of about 1 Å to 200 Å.

In an example embodiment, the first thickness t1 of the diffusion barrier layer 260 may be smaller than a second thickness t2 of the buffer layer 250. The thickness of the buffer layer 250 may be, for example, in the range of about 200 Å to 600 Å.

As the diffusion barrier layer 260 includes a material having a relatively low hydrogen permeability, diffusion of hydrogen or deuterium into the peripheral circuit structure PERI, injected in a hydrogen passivation process for the upper wiring structure UI and/or the gate contacts 162, may be prevented. Accordingly, a semiconductor device having improved productivity, addressing the issue of defective circuit devices 220 caused by hydrogen or deuterium, may be provided. The hydrogen passivation process may be performed to improve electrical performance of the wiring structure, such as addressing defects in the upper wiring structure UI and/or the gate contacts 162.

Also, the semiconductor device 100 having an improved integration density by the diffusion barrier layer 260 having a low hydrogen permeability may be provided. As semiconductor devices have been highly integrated, each of the contact plugs may have a relatively increased aspect ratio, and accordingly, the hydrogen passivation process time and the amount of emitted hydrogen may increase. However, in the semiconductor device 100 according to the example embodiments, even when the amount of hydrogen discharged by the hydrogen passivation process increases due to the high integration density of the semiconductor device, the defects in the peripheral circuit structure PERI caused by diffusion of hydrogen may be prevented without increasing the thickness of the diffusion barrier layer 260 or while reducing the thickness.

The memory cell structure CELL may include a second substrate 101 disposed on the diffusion barrier layer 260 and having a first region A and a second region B, a first horizontal conductive layer 102 on the first region A of the second substrate 101, a horizontal insulating layer 110 disposed parallel to or coplanar with the first horizontal conductive layer 102 on the second region B of the second substrate 101, a second horizontal conductive layer 104 on the first horizontal conductive layer 102 and the horizontal insulating layer 110, the gate electrodes 130 alternately stacked on the second horizontal conductive layer 104, isolation structures MS1 and MS2 penetrating through the stack structure of the gate electrodes 130, upper isolation structures SS penetrating a portion of the stack structure, channel structures CH penetrating the stack structure and including a channel layer 140, and an upper wiring structure UI electrically connected to the gate electrodes 130 and the channel structures CH.

The memory cell structure CELL may further include substrate insulating layers 105i and 105o, interlayer insulating layers 120 alternately stacked with gate electrodes 130 on the second substrate 101, gate contacts 162 connected to the gate electrodes 130, a substrate contact 164 connected to the second substrate 101, a cell region insulating layer 190 covering the gate electrodes 130, and an upper protective layer 195.

The memory cell structure CELL may further include an external side region C disposed adjacent to the second substrate 101 on an external side of the second substrate 101. Also, the semiconductor device 100 may further include a first through-via 165 penetrating the internal substrate insulating layer 105i and penetrating the second region B of the second substrate 101, and a second through-via 167 penetrating the external substrate insulating layer 105o disposed in the external side region C and connecting the memory cell structure CELL to the peripheral circuit structure PERI.

In an example embodiment, the diffusion barrier layer 260 may extend from a region between the second lower insulating layer 294 and the second substrate 101 to a region between the second lower insulating layer 294 and the external substrate insulating layer 105o.

The first region A of the second substrate 101 may be a region in which the gate electrodes 130 are vertically stacked and the channel structures CH are disposed, and memory cells may be disposed in the first region A. The second region B may be a region in which the gate electrodes 130 extend by different lengths, and may be a region for electrically connecting the memory cells to the peripheral circuit structure PERI. The second region B may be disposed on at least one end of the first region A in at least one direction, that is, for example, the x direction.

The second substrate 101 may have an upper surface extending in the x direction and the y direction. The second substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

The first and second horizontal conductive layers 102 and 104 may be stacked in sequence on the upper surface of the first region A of the second substrate 101. The first horizontal conductive layer 102 may not extend into the second region B of the second substrate 101, and the second horizontal conductive layer 104 may extend into the second region B of the second substrate 101.

The first horizontal conductive layer 102 may function as a portion of a common source line of the semiconductor device 100, that is, for example, as a common source line together with the second substrate 101. As illustrated in the enlarged diagram in FIG. 2B, the first horizontal conductive layer 102 may be directly connected to the channel layer 140 around the channel layer 140.

The second horizontal conductive layer 104 may be in contact with the second substrate 101 in a portion of regions in which the first horizontal conductive layer 102 and the horizontal insulating layer 110 are not disposed. The second horizontal conductive layer 104 may be bent while covering an end of the first horizontal conductive layer 102 or the horizontal insulating layer 110 in the above-mentioned regions, and may extend onto the second substrate 101. That is, the second horizontal conductive layer 104 may fill a space between the first horizontal conductive layer 102 and the horizontal insulating layer 110. The first and second horizontal conductive layers 102 and 104 may include a semiconductor material, and for example, both the first and second horizontal conductive layers 102 and 104 may include polycrystalline silicon. In this case, at least the first horizontal conductive layer 102 may be a doped layer, and the second horizontal conductive layer 104 may be a doped layer or a layer including impurities diffused from the first horizontal conductive layer 102.

The horizontal insulating layer 110 may be disposed on the second substrate 101 and may be disposed parallel to the first horizontal conductive layer 102 in at least a portion of the second region B. The horizontal insulating layer 110 may be layers remaining after a portion of the first horizontal conductive layer 102 is replaced in the process of manufacturing the semiconductor device 100.

The horizontal insulating layer 110 may include silicon oxide, silicon nitride, silicon carbide, or silicon oxynitride. In an example embodiment, the horizontal insulating layer 110 may include first to third horizontal insulating layers stacked in sequence, and the first and third horizontal insulating layers may be silicon oxide layers and the second horizontal insulating layer may be a silicon nitride layer.

The substrate insulating layers 105$i$ and 105$o$ may be disposed in a region from which a portion of the second substrate 101, the first and second horizontal conductive layers 102 and 104, and the horizontal insulating layer 110 are removed, and may be disposed to be in contact with the side surfaces of the second substrate 101, the first and second horizontal conductive layers 102 and 104, and the horizontal insulating layer 110. The lower surfaces of the substrate insulating layers 105$i$ and 105$o$ may be coplanar with the lower surface of the second substrate 101 or may be disposed on a vertical level lower than a level of the lower surface of the second substrate 101. The substrate insulating layers 105$i$ and 105$o$ may be formed of an insulating material, and may include, for example, silicon oxide, silicon oxynitride, or silicon nitride.

In an example embodiment, the substrate insulating layers 105$i$ and 105$o$ may further include an internal substrate insulating layer 105$i$ penetrating the second substrate 101, the horizontal insulating layer 110, and the second horizontal conductive layer 104, and an external substrate insulating layer 105$o$ disposed in the external side region C on the external side of the second substrate 101. In the example embodiments, the through-wiring region TR may refer to a region overlapping the internal substrate insulating layer 105$i$ in the vertical direction (z direction).

The gate electrodes 130 may be vertically stacked and spaced apart from each other on the second substrate 101 and may form a stack structure. The gate electrodes 130 may be vertically stacked and spaced apart from each other on the first region A, may extend from the first region A to the second region B by different lengths and may form a stepped structure in the form of a staircase shape. As illustrated in FIG. 2A, the gate electrodes 130 may form a stepped structure between the gate electrodes 130 in the x direction. Due to the stepped structure, the gate electrodes 130 may form a staircase shape in which the lower gate electrode 130 may extend longer than the upper gate electrode 130, and may provide ends exposed upwardly from the interlayer insulating layers 120. The ends may be gate pads in which the gate electrodes 130 and the gate contacts 162 are in contact with each other. In example embodiments, the gate pads may have a relatively increased thickness as compared to the other regions of the gate electrodes 130.

As illustrated in FIG. 1, the gate electrodes 130 may be isolated from each other in the y direction by isolation structures MS1 and MS2 extending in the x direction. The gate electrodes 130 between the pair of first isolation structures MS1 may form a single memory block, but the example embodiment of the memory block is not limited thereto.

The gate electrodes 130 may include a metal material, such as, for example, tungsten (W). In example embodiments, the gate electrodes 130 may include polycrystalline silicon or a metal silicide material. In an example embodiment, the gate electrodes 130 may further include a gate conductive layer and a gate dielectric layer covering a side surface, an upper surface, and a lower surface of the gate conductive layer. The gate dielectric layer may be disposed between the interlayer insulating layers 120 and the gate conductive layer and between the channel structures CH and the gate conductive layer. The gate dielectric layer may include, for example, aluminum oxide (AlO).

The interlayer insulating layers 120 may be alternately stacked with the gate electrodes 130 on the second substrate 101 and may form a stack structure. The interlayer insulating layers 120 may be disposed between the gate electrodes 130. Similar to the gate electrodes 130, the interlayer insulating layers 120 may be spaced apart from each other in a direction perpendicular to the upper surface of the second substrate 101 and may extend in the x direction. The interlayer insulating layers 120 may include an insulating material such as silicon oxide or silicon nitride.

As illustrated in FIGS. 1 and 2B, the isolation structures MS1 and MS2 may be disposed to penetrate through the gate electrodes 130 and may extend in the x direction or the z direction. The isolation structures MS1 and MS2 may penetrate the entirety of the gate electrodes 130 stacked on the second substrate 101 and may be connected to the second substrate 101. The isolation structures MS1 and MS2 may penetrate the first horizontal conductive layer 102 on the first region A and may penetrate the horizontal insulating layer 110 on the second region B. The isolation structures MS1 and MS2 may have a shape of which a width decreases toward the second substrate 101 due to a high aspect ratio. The isolation structures MS1 and MS2 may be spaced apart from each other in the y direction and may be disposed parallel to each other. In an example embodiment, the isolation structures MS1 and MS2 may include silicon oxide, silicon nitride, silicon oxynitride, or a combination thereof, and in example embodiment, the isolation structures MS1 and MS2 may include a conductive pattern and an insulating material layer covering a side surface of the conductive pattern.

In an example embodiment, the isolation structures MS1 and MS2 may include first isolation structures MS1 extending as an integrated region along the first region A and the second region B, and second isolation structures MS2 extending to a portion of the second region B or may be intermittently disposed on the first region A and the second region B. However, the arrangement order of the first and second isolation structures MS1 and MS2 and a spacing therebetween may be varied.

The upper isolation structures SS may extend in the x direction between the isolation structures MS1 and MS in the first region A. The upper isolation structures SS may be disposed between the first isolation structures MS1 and the second isolation structures MS2. The upper isolation structures SS may be disposed to penetrate a portion of the gate electrodes 130 including the uppermost gate electrode among the gate electrodes 130. The upper isolation structures SS may isolate the gate electrodes 130 from each other in the y direction. However, the number of gate electrodes 130 isolated by the upper isolation structures SS may be varied in example embodiments. The gate electrodes 130 isolated by the upper isolation structures SS may form different string selection lines. The upper isolation structures SS may include an insulating material, such as, for example, silicon oxide, silicon nitride, or silicon oxynitride.

Each of the channel structures CH may form a memory cell string, and may be spaced apart from each other while forming rows and columns on the first region A. The channel structures CH may be disposed to form a grid pattern in an x-y plane or may be disposed in a zigzag pattern in one direction. The channel structures CH may penetrate the gate electrodes 130, the second horizontal conductive layer 104, and the first horizontal conductive layer 102 and may be in contact with the second substrate 101. The channel structures CH may extend into the second substrate 101 and may be in contact with the second substrate 101, but an example embodiment thereof is not limited thereto. The channel structures CH may have a columnar shape, and may have an inclined side surface of which a width may decrease toward the second substrate 101 depending on an aspect ratio. In example embodiments, dummy channels not substantially forming a memory cell string may be further disposed on the end of the first region A adjacent to the second region B and the second region B.

As illustrated in the enlarged diagram in FIG. 2B, the channel structures CH may include the channel layer 140. The channel layer 140 may be formed in an annular shape surrounding the channel filling insulating layer 144 therein, but the channel layer 140 may have a columnar shape such as a cylindrical shape or a prism shape without the channel filling insulating layer 144 in example embodiments. The channel filling insulating layer 144 may include an insulating material such as silicon oxide. The channel layer 140 may be connected to the first horizontal conductive layer 102 in a lower portion. The channel layer 140 may include a semiconductor material such as polycrystalline silicon or single crystal silicon. The channel structures CH disposed linearly in the y direction between the first or second isolation structures MS1 and MS2 and the upper isolation structures SS may be electrically isolated from each other by the upper wiring structure UI connected to the channel pads 145.

In an example embodiment, each of the channel structures CH may further include a dielectric layer 142 and a conductive pad 145. The dielectric layer 142 may be disposed between the gate electrodes 130 and the channel layer 140. The dielectric layer 142 may surround at least a portion of an external side surface of the channel layer 140. Although not specifically illustrated, the dielectric layer 142 may include a tunneling layer, a charge storage layer, and a blocking layer stacked in sequence from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may block the charges trapped in the charge storage layer from moving to the gate electrodes 130, and may include, for example, silicon oxide ($SiO_2$), silicon nitride ($Si_3N_4$), silicon oxynitride (SiON), high-k dielectric material or a combination thereof.

As illustrated in the enlarged diagram in FIG. 2B, the first horizontal conductive layer 102 may include a portion penetrating the dielectric layer 142 and in contact with the channel layer 140. The contact portion may cover at least a portion of a side surface of the second horizontal conductive layer 104 and at least a portion of a side surface of the second substrate 101.

The channel pad 145 may be disposed to be electrically connected to the channel layer 140. In an example embodiment, the channel pad 145 may cover the upper surface of the channel filling insulating layer 144 on the upper surface of the channel filling insulating layer 144, and the channel layer 140 may surround the side surface of the channel pad 145. Alternatively, the channel pad 145 may be disposed on the channel layer 140. The channel pad 145 may include, for example, doped polycrystalline silicon.

The cell region insulating layer 190 may be disposed to cover the second substrate 101, the gate electrodes 130 on the second substrate 101, and the lower insulating layer 290. The cell region insulating layer 190 may include first and second cell region insulating layers 192 and 194, and each of the first and second cell region insulating layers 192 and 194 may also include a plurality of insulating layers. The cell region insulating layer 190 may be formed of an insulating material.

The upper protective layer 195 may be disposed on the upper surface of the first upper wiring lines 182 between the first and second cell region insulating layers 192 and 194. In example embodiments, the upper protective layer 195 may be further disposed on the upper surfaces of the second upper wiring lines 184. The upper protective layer 195 may prevent contamination of the upper wiring lines 180 disposed therebelow due to a metal material. The upper protective layer 195 may be formed of an insulating material different from that of the cell region insulating layer 190, and may include, for example, silicon nitride.

The gate contacts 162 may be connected to the gate electrodes 130 on the second region B. The gate contacts 162 may be disposed to penetrate through at least a portion of the first cell region insulating layer 192 and to be connected to each of the gate electrodes 130 exposed upwardly.

The substrate contact 164 may be connected to the second substrate 101 on the end of the second region B. The substrate contact 164 may penetrate at least a portion of the first cell region insulating layer 192, may penetrate the first and second horizontal conductive layers 102 and 104 exposed upwardly, and be connected to the second substrate 101. The substrate contact 164 may be spaced apart from the gate electrodes 130 and may be in contact with the second substrate 101. The substrate contact 164 may apply an electrical signal to, for example, a common source line including the second substrate 101.

The upper wiring structure UI may be a wiring structure electrically connected to the gate electrodes 130 and the channel structures CH. The upper wiring structure UI may include upper contact plugs 170, and upper wiring lines 180 formed in a line shape. The upper contact plugs 170 may include first to third upper contact plugs 172, 174, and 176. The first upper contact plugs 172 may be disposed on the channel pads 145 and the gate contacts 162, the second upper contact plugs 174 may be disposed on the first upper contact plugs 172, and the third upper contact plugs 176 may be disposed on the first upper wiring lines 182. The upper wiring lines 180 may include first and second upper wiring lines 182 and 184. The first upper wiring lines 182 may be disposed on the second upper contact plugs 174, and the second upper wiring lines 184 may be disposed on the third upper contact plugs 176. The upper wiring structure UI may include a conductive material, such as, for example, tungsten (W), copper (Cu), aluminum (Al), or the like, and may further include a diffusion barrier layer, respectively. However, in example embodiments, the number of layers of the upper contact plugs 170 and the upper wiring lines 180 included in the upper wiring structure UI and the arrangement form thereof may be varied.

The through-wiring region TR may include a through-wiring structure for electrically connecting the memory cell region CELL to the peripheral circuit region PERI in the region vertically overlapping at least a portion of the second region B of the second substrate 101. However, in example embodiments, the through-wiring region TR may be disposed with a predetermined distance therebetween even in a region vertically overlapping at least a portion of the first region A. The through-wiring region TR may include a first through-via 165 extending in the z-direction from an upper portion of the memory cell region CELL by penetrating through the second substrate 101, and an insulating region surrounding the first through-via 165. The insulating region may include sacrificial insulating layers 118, interlayer insulating layers 120 disposed perpendicularly to the sacrificial insulating layers 118, and an internal substrate insulating layer 105i. In example embodiments, the size, the arrangement form, and the shape of the through-wiring region TR may be varied.

The through-wiring region TR may be disposed to be spaced apart from the first and second isolation structures MS1 and MS2. For example, the through-wiring region TR may be disposed between a pair of first isolation structures MS1 adjacent to each other in the y direction. The sacrificial insulating layers 118 may remain in the through-wiring region TR.

The first through-via 165 may penetrate through the first cell region insulating layer 192, the insulating region, the diffusion barrier layer 260, the second lower insulating layer 294, and the buffer layer 250 from an upper portion and may extend perpendicularly to the upper surface of the second substrate 101. An upper end of the first through-via 165 may be connected to the upper wiring structure UI, and a lower end thereof may be connected to the lower wiring structure LI. In example embodiments, the number of the first through-vias 165, and the arrangement form and shape thereof in a single through-wiring region TR may be varied. The first through-via 165 may include a conductive material, such as, for example, a metal material such as tungsten (W), copper (Cu), or aluminum (Al).

The sacrificial insulating layers 118 may be disposed on the same vertical level as a level of the gate electrodes 130 and may have the same thickness, and may be disposed such that side surfaces thereof may be in contact with the gate electrodes 130 at the boundary of the through-wiring region TR. However, in example embodiments, a barrier structure may be further disposed between the sacrificial insulating layers 118 and the gate electrodes 130. The sacrificial insulating layers 118 may be alternately stacked with the interlayer insulating layers 120 and may form the insulating region. The sacrificial insulating layers 118 may be disposed to have the same width as or different widths from that of the lower internal substrate insulating layers 105i. The sacrificial insulating layers 118 may be formed of an insulating material different from that of the interlayer insulating layers 120, and may include, for example, silicon oxide, silicon nitride, or silicon oxynitride.

The second through-via 167 may extend to the peripheral circuit structure PERI by penetrating through the external substrate insulating layer 105o disposed in the external side region C. The second through-via 167 may be disposed to connect the upper wiring structure UI to the lower wiring structure LI similar to the first through-via 165 of the through-wiring region TR. The second through-via 167 may include a conductive material, such as, for example, a metal material such as tungsten (W), copper (Cu), or aluminum (Al).

In an example embodiment, each of the first and second through-vias 165 and 167 may include a conductive pattern formed of the conductive material and a barrier layer covering a side surface and a bottom surface of the conductive pattern. The barrier layer may include a metal nitride. In an example embodiment, the barrier layer may include a portion in contact with the diffusion barrier layer 260 and the buffer layer 250. However, in example embodiments, each of the first and second through-vias 165 and 167 may further include a via spacer covering a side surface of the barrier layer, and the barrier layer, the diffusion barrier layer 260 and the buffer layer 250 may be spaced apart from each other.

The ground wiring structure GI may be disposed throughout the peripheral circuit structure PERI and the memory cell structure CELL to connect the first substrate 201 to the second substrate 101. The ground wiring structure GI may perform a function of grounding the second substrate 101 during the process of manufacturing the semiconductor device 100. The ground wiring structure GI may be referred to be distinct from the lower and upper wiring structures LI and UI in the example embodiments.

Although only a portion is illustrated in FIG. 2A, a plurality of the ground wiring structures GI may be spaced apart from each other with a predetermined distance therebetween within the semiconductor device 100. The ground wiring structure GI may be disposed below the second region B of the second substrate 101. However, in example embodiments, the ground wiring structure GI may be disposed below the first region A of the second substrate 101. The ground wiring structure GI may be disposed to be spaced apart from the circuit devices 220 in the peripheral circuit region PERI.

In an example embodiment, the ground wiring structure GI may include a lower via GV. The lower via GV may directly extend from the second substrate 101 to the first substrate 201 without being connected to another wiring structure. However, in example embodiments, the ground wiring structure GI may further include a separate wiring structure in addition to the lower via GV.

The lower via GV may penetrate through the diffusion barrier layer 260, the second lower insulating layer 294, the buffer layer 250, and the first lower insulating layer 292 in sequence and may extend into the first substrate 201. The lower via GV may have a shape or structure integrated with the second substrate 101 of the memory cell region CELL, and in this case, the lower via GV may have a shape or structure in which the second substrate 101 extends into the via hole toward the first substrate 201. However, the shape of the lower via GV is not limited thereto and may be varied.

The diffusion barrier layer 260 may be disposed between the second lower insulating layer 294 and the second substrate 101. A lower surface of the diffusion barrier layer 260 may be in contact with the second lower insulating layer 294, and an upper surface of the diffusion barrier layer 260 may be in contact with the second substrate 101.

Figure 4:
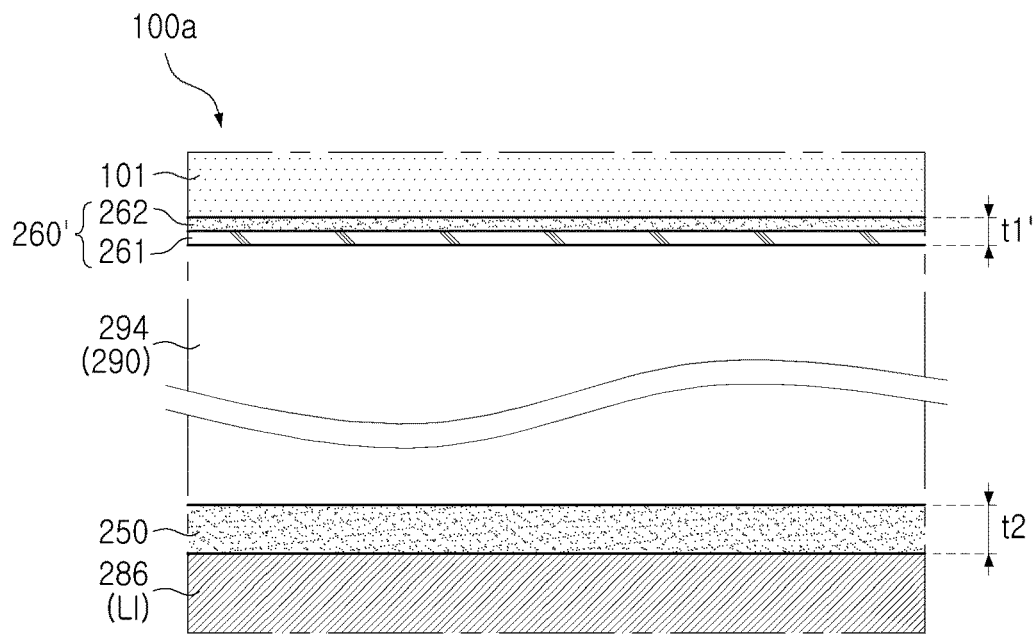
FIG. 4 is an enlarged diagram illustrating a portion of a semiconductor device according to an example embodiment of the present disclosure.

FIG. 4 is an enlarged diagram illustrating a portion of a semiconductor device according to an example embodiment, corresponding to region "D" in FIG. 2A.

Referring to FIG. 4, the semiconductor device 100a may include a diffusion barrier layer 260' different from that of the semiconductor device 100 in FIG. 3A.

The diffusion barrier layer 260' may further include the first material layer 261 and the second material layer 262 disposed on the upper surface of the first material layer 261, described with reference to FIGS. 1 to 3B. The second material layer 262 may be disposed between the first material layer 261 and the second substrate 101. The second material layer 262 may include a material different from that of the first material layer 261. The first material layer 261 may include a material having a hydrogen permeability lower than that of the second material layer 262. The second material layer 262 may include, for example, silicon nitride.

The first material layer 261 may have the same thickness as that of the second material layer 262, but an example embodiment thereof is not limited thereto, and the first material layer 261 may have a thickness smaller or larger than that of the second material layer 262.

The first thickness t1' of the diffusion barrier layer 260' may refer to the sum of the thicknesses of the first material layer 261 and the second material layer 262. In an example embodiment, the first thickness t1' of the diffusion barrier layer 260' may be smaller than the second thickness t2 of the buffer layer 250.

Figure 5:
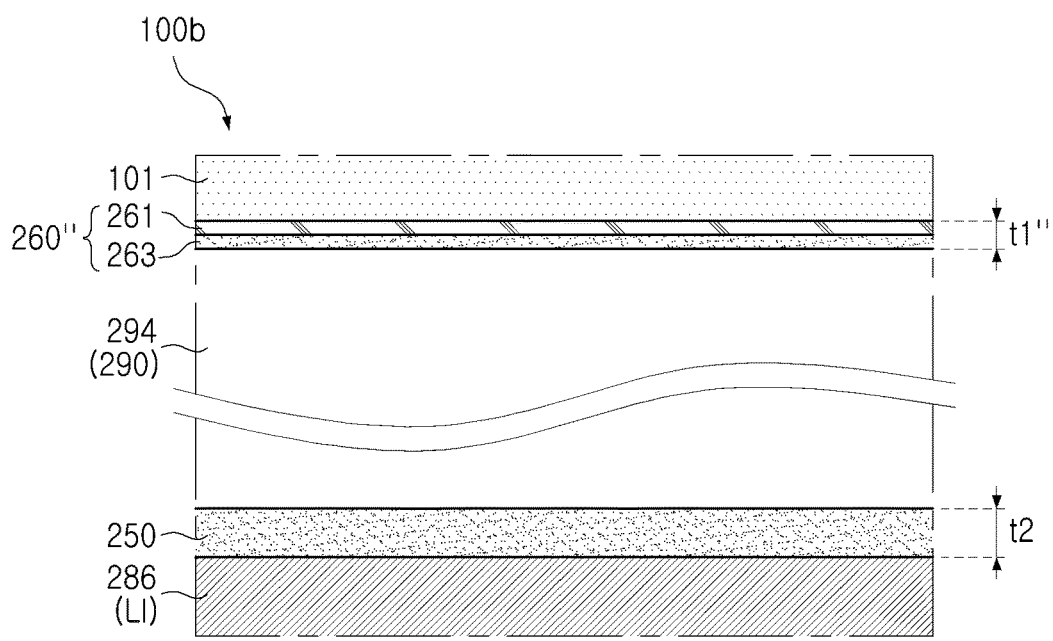
FIG. 5 is an enlarged diagram illustrating a portion of a semiconductor device according to an example embodiment of the present disclosure.

FIG. 5 is an enlarged diagram illustrating a portion of a semiconductor device according to an example embodiment, corresponding to region "D" in FIG. 2A.

Referring to FIG. 5, the semiconductor device 100b may include a diffusion barrier layer 260" different from that of the semiconductor device 100 in FIG. 3A.

The diffusion barrier layer 260" may further include the first material layer 261 and the third material layer 263 disposed on the lower surface of the first material layer 261, described with reference to FIGS. 1 to 3B. The third material layer 263 may be disposed between the first material layer 261 and the second lower insulating layer 294. The third material layer 263 may include a material different from that of the first material layer 261. The first material layer 261 may include a material having a hydrogen permeability lower than that of the third material layer 263. The third material layer 263 may include, for example, silicon nitride.

The first material layer 261 may have the same thickness as that of the third material layer 263, but an example embodiment thereof is not limited thereto, and the first material layer 261 may have a thickness smaller or larger than that of the third material layer 263.

The first thickness t1" of the diffusion barrier layer 260" may refer to the sum of the thicknesses of the first material layer 261 and the third material layer 263. In an example embodiment, the first thickness t1' of the diffusion barrier layer 260" may be smaller than the second thickness t2 of the buffer layer 250.

Figure 6:
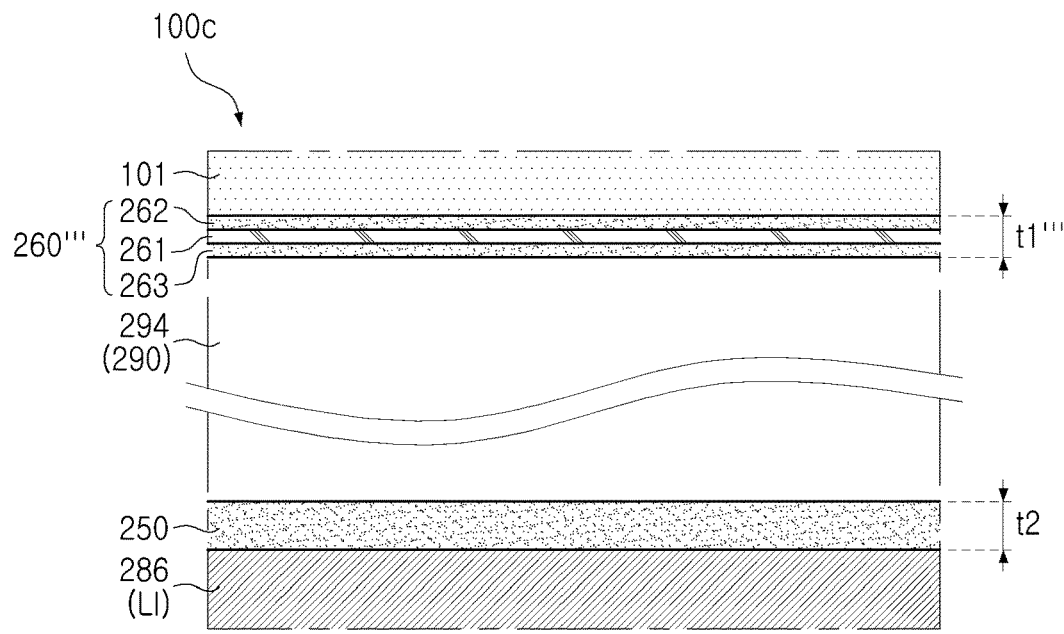
FIG. 6 is an enlarged diagram illustrating a portion of a semiconductor device according to an example embodiment of the present disclosure.

FIG. 6 is an enlarged diagram illustrating a portion of a semiconductor device according to an example embodiment, corresponding to region "D" in FIG. 2A.

Referring to FIG. 6, the semiconductor device 100c may include a diffusion barrier layer 260''' different from that of the semiconductor device 100 in FIG. 3A.

The diffusion barrier layer 260" may include the first material layer 261, the second material layer 262 disposed on the upper surface of the first material layer 261, and the third material layer 263 disposed on the lower surface of the first material layer 261, described with reference to FIGS. 1 to 3B. The second material layer 262 may be disposed between the second substrate 101 and the first material layer 261, and the third material layer 263 may be disposed between the first material layer 261 and the second lower insulating layer 294. The second material layer 262 and the third material layer 263 may include a material different from that of the first material layer 261. The first material layer 261 may include a material having a hydrogen permeability lower than that of the second and third material layers 262 and 263. For example, at least one of the second material layer 262 and the third material layer 263 may include silicon nitride.

The first to third material layers 261, 262, and 263 may have the same thickness, but an example embodiment thereof is not limited thereto.

The first thickness t1''' of the diffusion barrier layer 260''' may refer to the sum of the thicknesses of the first to third material layers 261, 262, and 263. In an example embodiment, the first thickness t1''' of the diffusion barrier layer 260''' may be smaller than the second thickness t2 of the buffer layer 250.

Figure 7:
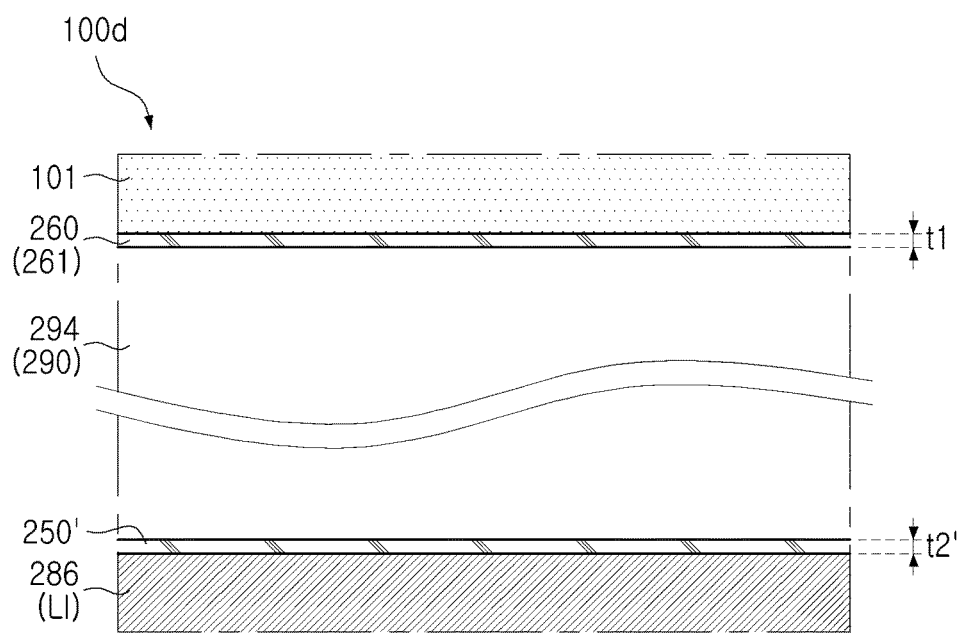
FIG. 7 is an enlarged diagram illustrating a portion of a semiconductor device according to an example embodiment of the present disclosure.

FIG. 7 is an enlarged diagram illustrating a portion of a semiconductor device according to an example embodiment, corresponding to region "D" in FIG. 2A.

Referring to FIG. 7, the semiconductor device 100d may include a buffer layer 250' different from that of the semiconductor device 100 in FIG. 3A.

The buffer layer 250' may include a material having a hydrogen permeability lower than that of silicon nitride. The hydrogen permeability of the buffer layer 250' may be less than about $7.4*10^{12}/m^2$ s (at 1 nm, 1 bar).

The buffer layer 250' may include a two-dimensional material, polycrystalline silicon, or metal oxide. The two-dimensional material may include graphene, hexagonal boron nitride (h-BN), black phosphorus, or transition metal di-chalcogenide (TMDC). In an example embodiment, when the buffer layer 250' is configured as a two-dimensional material layer, the buffer layer 250' may have a multilayer form in which one type of two-dimensional materials are stacked in a plurality of layers. However, in example embodiments, the buffer layer 250' may have a heterostructure in which two or more types of two-dimensional materials are a stacked in a plurality of layers. The buffer layer 250' may include the same material as that of the first material layer 261 of the diffusion barrier layer 260, but an example embodiment thereof is not limited thereto and the buffer layer 250' may include different materials.

In an example embodiment, the buffer layer 250' may have a second thickness t2' smaller than the second thickness t2 of the buffer layer 250 in FIGS. 1 to 3B. Since the buffer layer 250' includes a material having a relatively low hydrogen permeability, the buffer layer 250' may prevent hydrogen from diffusing into the peripheral circuit structure PERI together with the diffusion barrier layer 260. The second thickness t2' of the buffer layer 250' may be the same as the first thickness t1 of the diffusion barrier layer 260, but an example embodiment thereof is not limited thereto, and the buffer layer 250' and the diffusion barrier layer 260 may have different thicknesses.

Also, different from the illustrated example, the buffer layer 250' may include a plurality of layers having different materials, similar to the example described with respect to the diffusion barrier layer structure in FIGS. 4 to 6.

Figure 8:
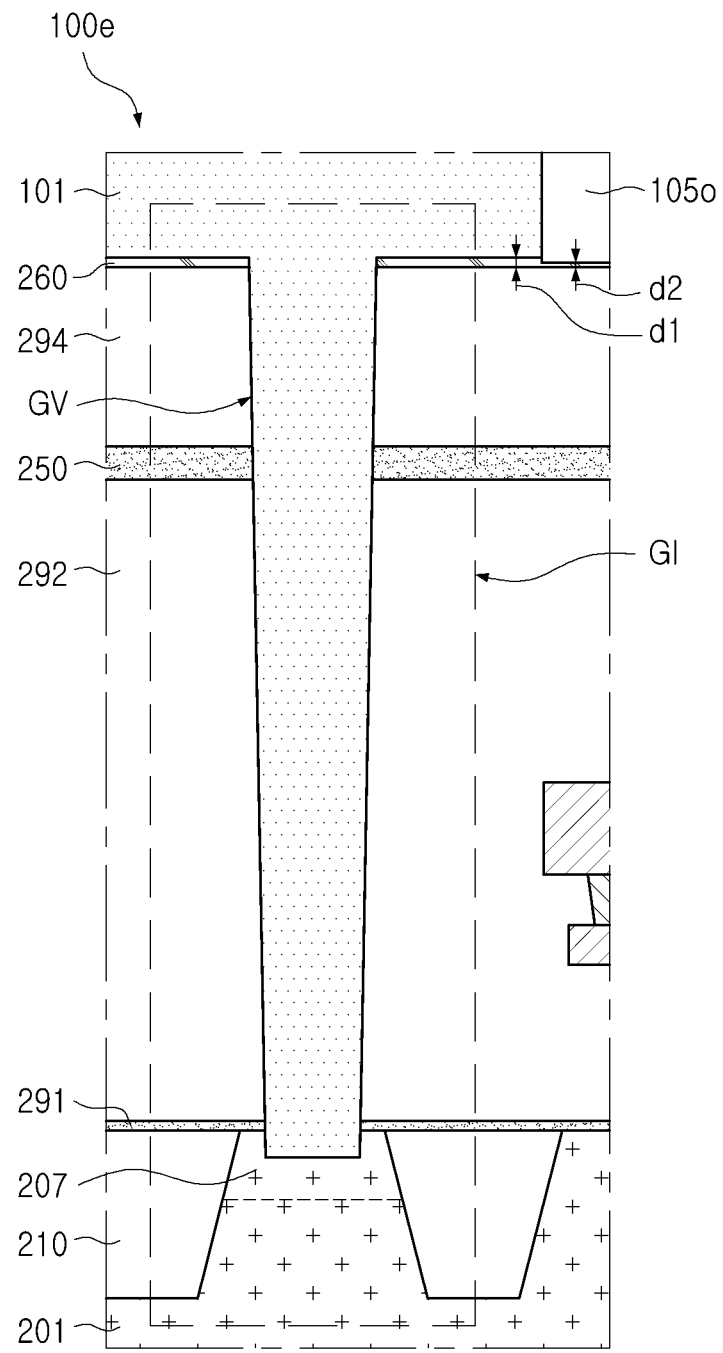
FIG. 8 is an enlarged diagram illustrating a portion of a semiconductor device according to an example embodiment of the present disclosure.

FIG. 8 is an enlarged diagram illustrating a portion of a semiconductor device according to an example embodiment, corresponding to region "E" in FIG. 2A.

Referring to FIG. 8, the diffusion barrier layer 260 may include a first region having a thickness of a first length d1 and a second region having a thickness of a second length d2 smaller than the first length d1. The first region may overlap the second substrate 101 in a direction perpendicular to the upper surface of the second substrate 101, that is, for example, in the z-direction, and the second region may be the remaining region. The second region may have a thickness smaller than the first length d1 as a portion of the diffusion barrier layer 260 is etched in the process of forming the substrate insulating layers 105i and 105o. Also, in example embodiments, the entirety of the diffusion barrier layer 260 in the second region may be etched such that the diffusion barrier layer 260 may be disposed only in the region corresponding to the first region.

Figure 9:
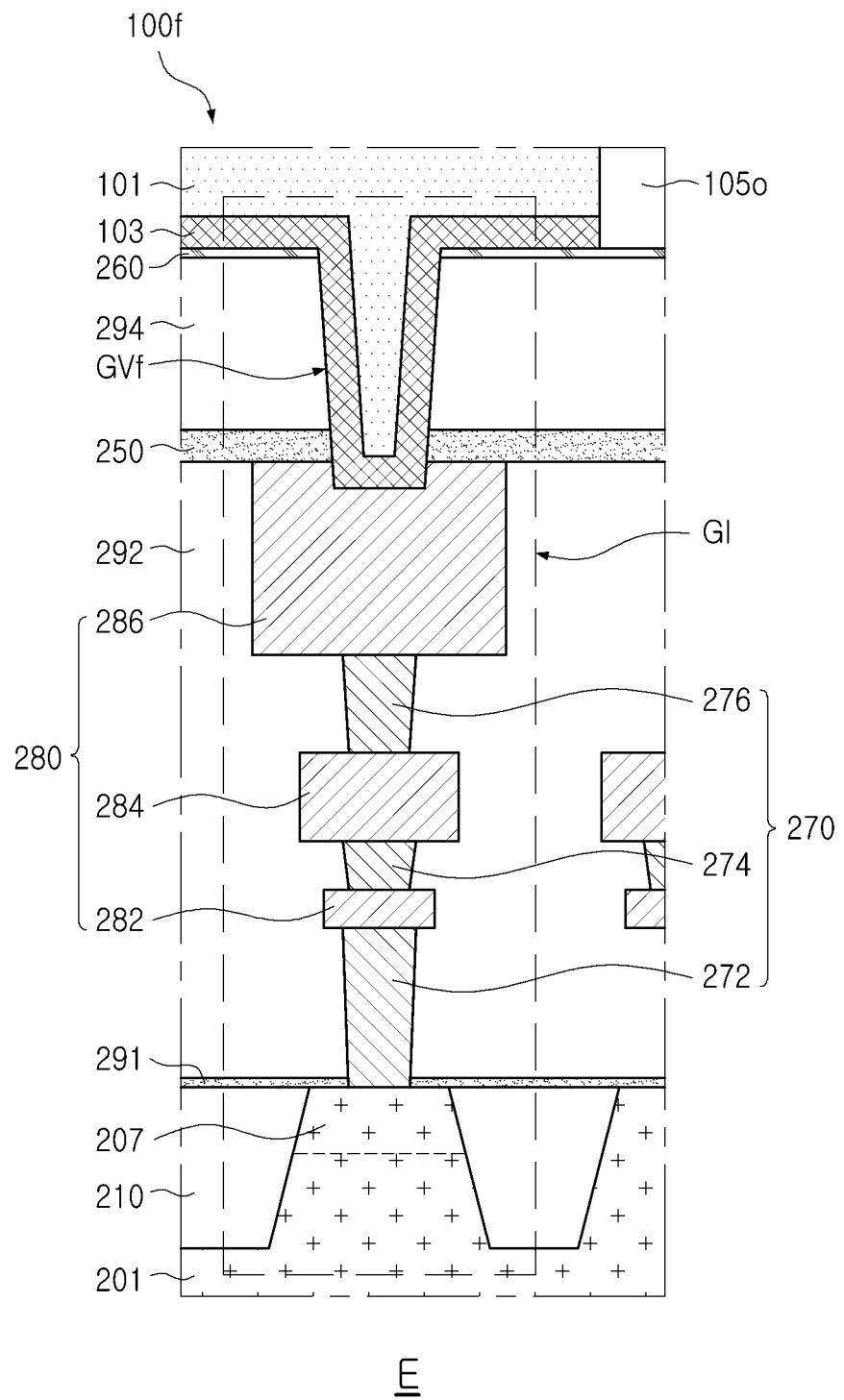
FIG. 9 is an enlarged diagram illustrating a portion of a semiconductor device according to an example embodiment of the present disclosure.

FIG. 9 is an enlarged diagram illustrating a portion of a semiconductor device according to an example embodiment, corresponding to region "E" in FIG. 2A.

Referring to FIG. 9, the ground wiring structure GI may include lower contact plugs 270 and lower wiring lines 280, which may be the lower wiring structure LI, and may further include a lower via GVf connected to the uppermost third lower wiring lines 286 among the lower wiring lines 280.

The lower via GVf may extend into the peripheral circuit structure PERI by penetrating through the diffusion barrier layer 260, the second lower insulating layer 294, and the buffer layer 250, and may be directly connected to the third lower wiring lines 286. The lower via GVf may have a shape or structure integrated with the second substrate 101 of the memory cell region CELL, and in this case, the lower via GVf may have a form in which the second substrate 101 extends into the via hole toward the second substrate 101. However, the shape of the lower via GVf is not limited thereto and may have various shapes.

In an example embodiment, the lower via GVf may further include a barrier layer 103 extending from a lower surface of the second substrate 101. The barrier layer 103 may extend from a lower surface of the second substrate 101 along an internal side wall of the via hole to cover a bottom surface of the via hole. The barrier layer 103 may include a metal nitride, such as, for example, titanium nitride (TiN), titanium silicon nitride (TiSiN), tungsten nitride (WN), tantalum nitride (TaN), or a combination thereof. However, in example embodiments, the barrier layer 103 may not be provided.

The wiring structure forming the ground wiring structure GI may include components corresponding to the lower wiring structure LI, and may be electrically isolated from the lower wiring structure LI. The wiring structure may include first to third lower contact plugs 272, 274 and 276 and first to third lower wiring lines 282, 284 and 286, spaced apart from the lower wiring structure LI.

FIGS. 10A to 10G are cross-sectional diagrams illustrating a method of manufacturing a semiconductor device according to an example embodiment, corresponding to regions illustrated in FIG. 2A.

Figure 10A:
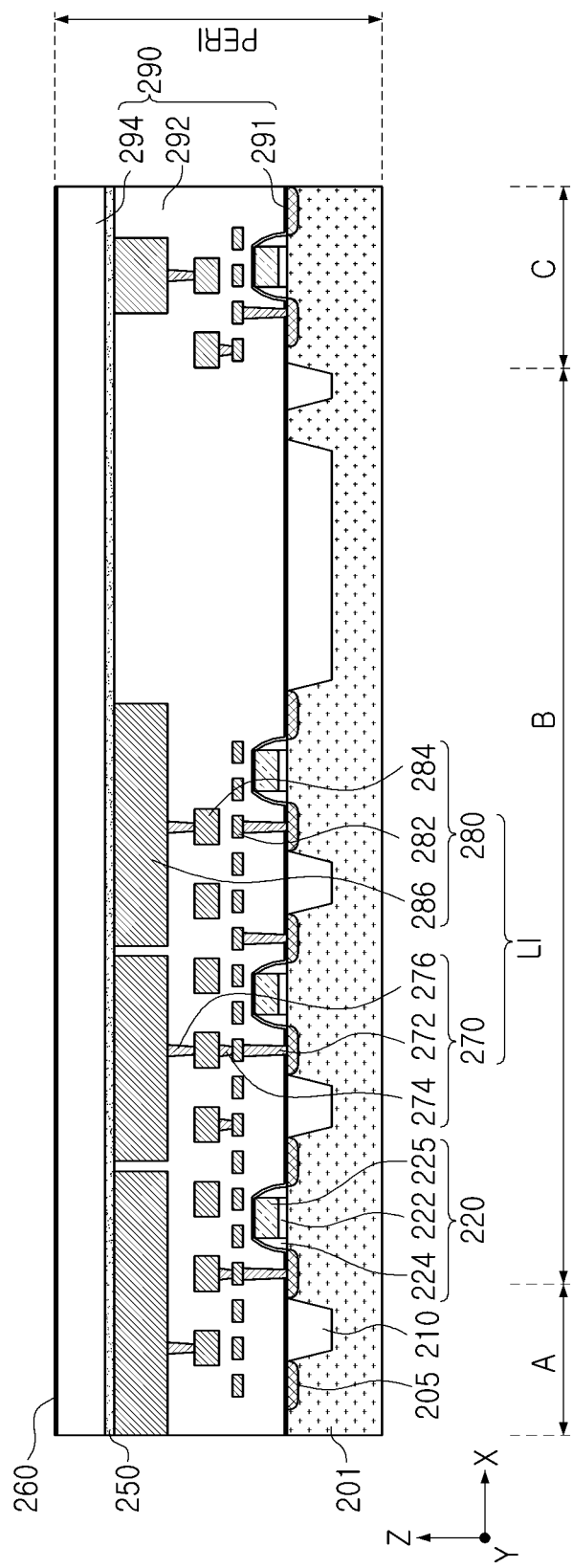
FIGS. 10A to 10G are cross-sectional diagrams illustrating a method of manufacturing a semiconductor device according to an example embodiment of the present disclosure.

Referring to FIG. 10A, a peripheral circuit structure PERI may be formed.

First, the device isolation layers 210 may be formed in the first substrate 201, and the circuit gate dielectric layer 222 and the circuit gate electrode 225 may be formed in sequence on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but an example embodiment thereof is not limited thereto. Thereafter, a spacer layer 224 and source/drain regions 205 may be formed on both sidewalls of the circuit gate dielectric layer 222 and the circuit gate electrode 225. In example embodiments, the spacer layer 224 may include a plurality of layers. Thereafter, the source/drain regions 205 may be formed by performing an ion implantation process.

Thereafter, an insulating liner 291 covering the circuit devices 220 may be formed on the first substrate 201. The insulating liner 291 may be formed to have a substantially uniform thickness using atomic layer deposition (ALD) or chemical vapor deposition (CVD).

The lower contact plugs 270 of the lower wiring structure LI may be formed by partially forming the first lower insulating layer 292, removing a portion thereof by etching, and filling a conductive material. The lower wiring lines 280 of the lower wiring structure LI may be formed by, for example, depositing a conductive material and patterning the conductive material.

The first lower insulating layer 292 may include a plurality of insulating layers. The first lower insulating layer 292 may become a portion in each process of forming the lower wiring structure LI.

A buffer layer 250 covering upper surfaces of the third lower wiring lines 286 may be formed on the first lower insulating layer 292. The buffer layer 250 may be formed using atomic layer deposition (ALD) or chemical vapor deposition (CVD). The buffer layer 250 may include, for example, silicon nitride.

The second lower insulating layer 294 may be formed on the buffer layer 250, and a diffusion barrier layer 260 covering the upper surface of the second lower insulating layer 294 may be formed. The diffusion barrier layer 260 may be formed using atomic layer deposition (ALD) or chemical vapor deposition (CVD). The diffusion barrier layer 260 may include a two-dimensional material, such as, for example, graphene. By forming the diffusion barrier layer 260, the entirety of the peripheral circuit structures PERI may be formed.

Figure 10B:
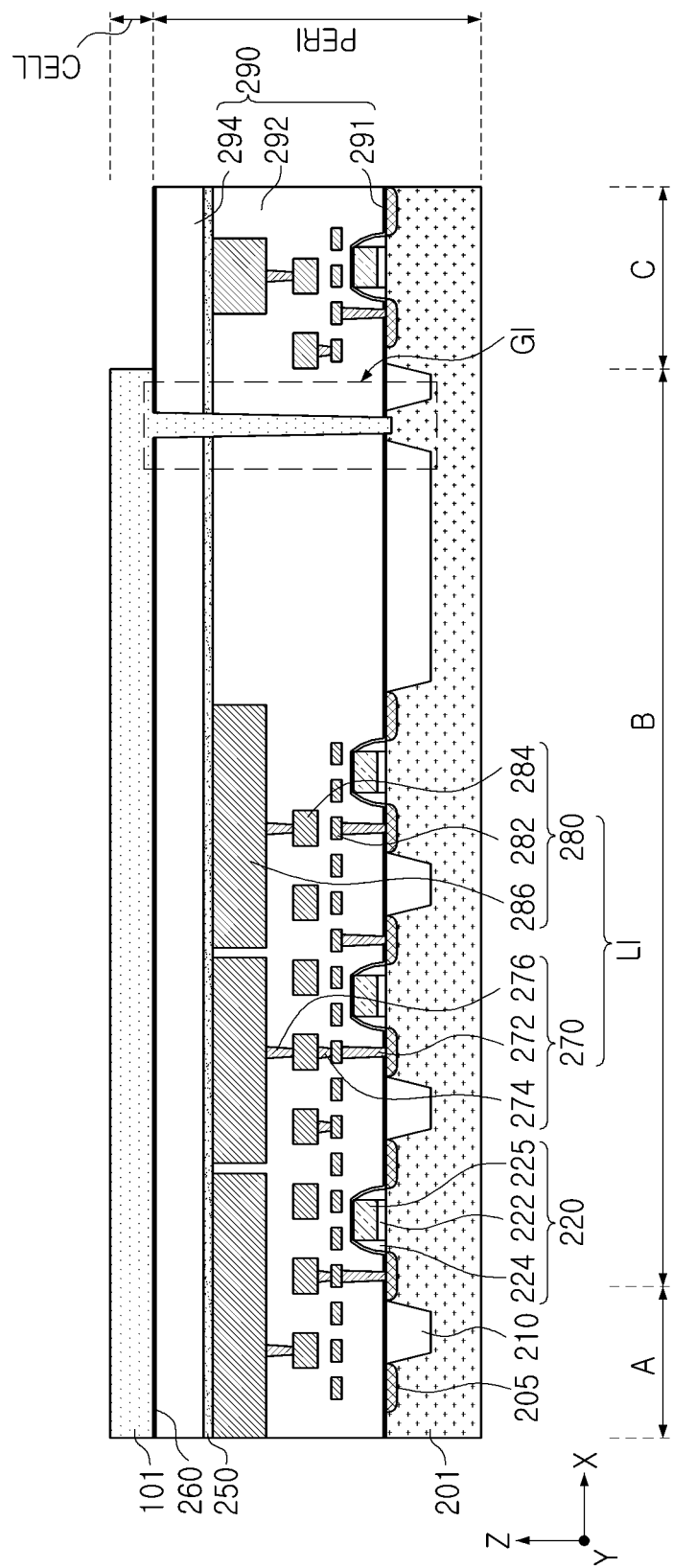

Referring to FIG. 10B, the second substrate 101 and the ground wiring structure GI may be formed.

First, a via hole may be formed by removing a portion of the second lower insulating layer 294 through an anisotropic etching process and the first substrate 201 may be exposed. The via hole may sequentially penetrate the diffusion barrier layer 260, the second lower insulating layer 294, the buffer layer 250, and the first lower insulating layer 292. The insulating liner 291 may function as an etch stop layer when the via hole is formed.

Thereafter, the second substrate 101 may be formed by depositing a semiconductor material filling the via hole and covering the diffusion barrier layer 260. The second substrate 101 may include, for example, polycrystalline silicon, and may be formed by a CVD process. When the second substrate 101 is formed, a material included in the second substrate 101 may fill the via hole such that a lower via GV (see FIG. 3B) may be formed, and accordingly, a ground wiring structure GI including the lower via GV may be formed.

The second substrate 101 may be formed on the entire diffusion barrier layer 260, may be patterned, and may be removed from partial regions including the external side region C. However, in example embodiments, the patterning process may not be performed in this process, the patterning process may be performed after the second horizontal conductive layer 104 (see FIG. 10C) is formed.

Figure 10C:
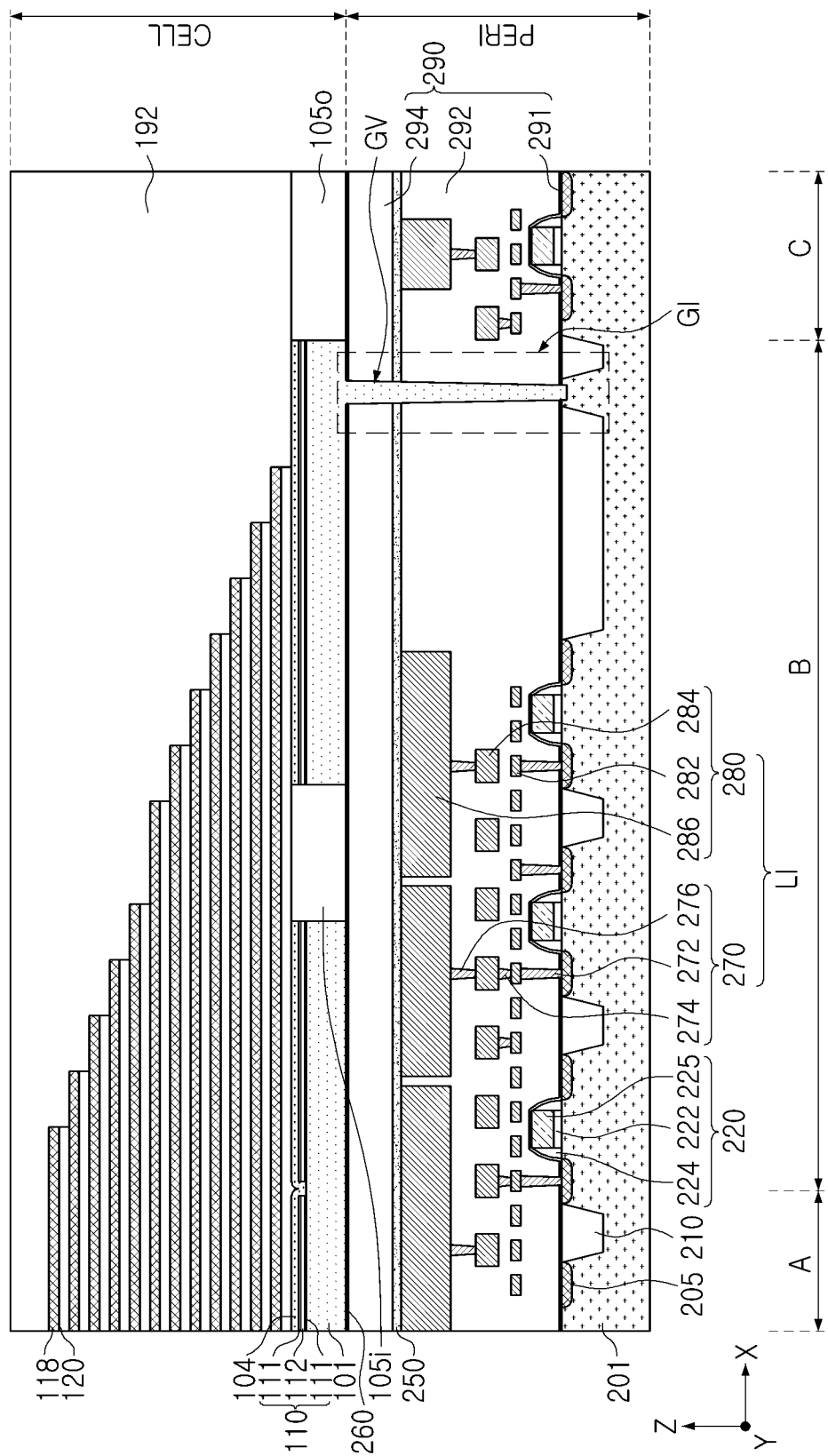

Referring to FIG. 10C, the horizontal insulating layer 110 and the second horizontal conductive layer 104 may be formed, the substrate insulating layers 105i and 105o may be formed, and the sacrificial insulating layers 118 and the interlayer insulating layers 120 may be alternately stacked.

The first and second horizontal insulating layers 111 and 112 included in the horizontal insulating layer 110 may be formed on the second substrate 101. The first and second horizontal insulating layers 111 and 112 may be stacked on the second substrate 101 such that the first horizontal insulating layers 111 may be disposed above and below the second horizontal insulating layer 112. The first and second horizontal insulating layers 111 and 112 may include different materials. For example, the first horizontal insulating layers 111 may be formed of the same material as that of the interlayer insulating layers 120, and the second horizontal insulating layer 112 may be formed of the same material as that of the sacrificial insulating layers 118. The horizontal insulating layer 110 may be replaced with the first horizontal conductive layer 102 in FIG. 2A through a subsequent process. The horizontal insulating layer 110 may be removed by a patterning process in partial regions.

The second horizontal conductive layer 104 may be formed on the first and second horizontal insulating layers 111 and 112, and may be in contact with the second substrate 101 in the region from which the horizontal insulating layer 110 is removed. Accordingly, the second horizontal conductive layer 104 may be bent along end portions of the horizontal insulating layer 110, may cover the ends, and may extend onto the second substrate 101.

The substrate insulating layers 105i and 105o may be formed by partially removing the first and second horizontal insulating layers 111 and 112, the second horizontal conductive layer 104, and the second substrate 101, and filling an insulating material. After the insulating material is filled, a planarization process may be further performed using a chemical mechanical polishing (CMP) process. Accordingly, upper surfaces of the substrate insulating layers 105i and 105o may be substantially coplanar with the upper surfaces of the second horizontal conductive layer 104.

Thereafter, sacrificial insulating layers 118 and interlayer insulating layers 120 alternately stacked on the second horizontal conductive layer 104 may be formed. The sacrificial insulating layers 118 may be partially replaced with the gate electrodes 130 (see FIG. 2A) through a subsequent process. The sacrificial insulating layers 118 may be formed of a material different from that of the interlayer insulating layers 120, and may be formed of a material etched with etching selectivity for the interlayer insulating layers 120 under specific etching conditions. For example, the interlayer insulating layers 120 may be formed of at least one of silicon oxide and silicon nitride, and the sacrificial insulating layers 118 may be formed of a material different from that of the interlayer insulating layers 120, selected from among silicon, silicon oxide, silicon carbide, and silicon nitride. In example embodiments, the thicknesses of the interlayer insulating layers 120 may not be the same. The thickness of the interlayer insulating layers 120 and the sacrificial insulating layers 118 and the number of films included in the interlayer insulating layers 120 and the sacrificial insulating layers 118 may be varied from the illustrated examples.

A photolithography process and an etching process may be repeatedly performed for the sacrificial insulating layers 118 using a mask layer such that the upper sacrificial insulating layers 118 may extend less than the lower sacrificial insulating layers 118 on the second region B. Accordingly, the sacrificial insulating layers 118 may form a stepped structure in a staircase form by a predetermined unit.

Thereafter, the first cell region insulating layer 192 covering the stack structure of the sacrificial insulating layers 118 and the interlayer insulating layers 120 may be formed.

Figure 10D:
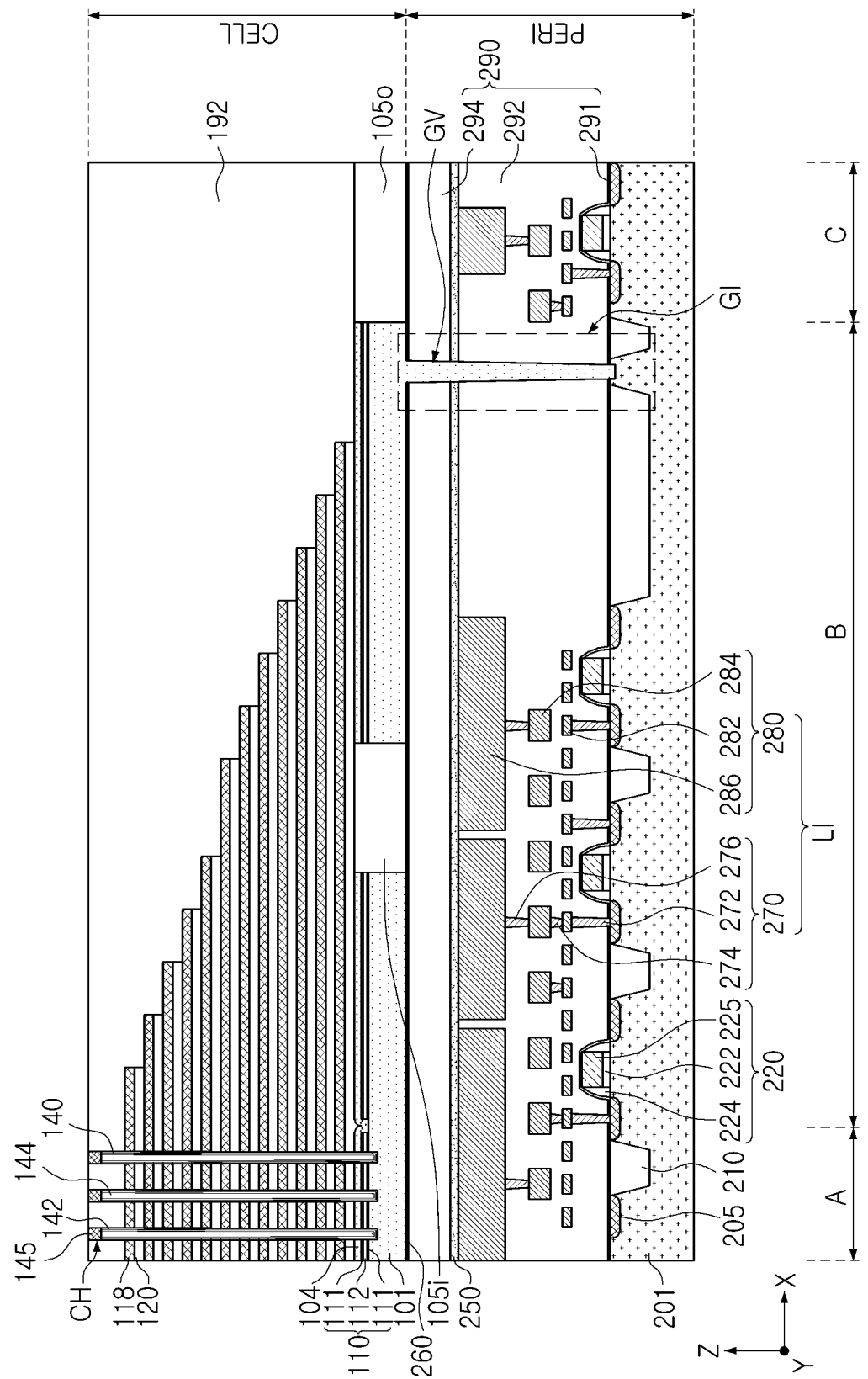

Referring to FIG. 10D, channel structures CH penetrating through the stack structure of the sacrificial insulating layers 118 and the interlayer insulating layers 120 may be formed.

Upper isolation structures SS (see FIG. 2B) may be formed by removing a portion of the sacrificial insulating layers 118 and the interlayer insulating layers 120. The upper isolation structures SS may be formed by exposing a region in which the upper isolation structures SS are to be formed using a mask layer, removing a predetermined number of the sacrificial insulating layers 118 and the interlayer insulating layers 120, and depositing an insulating material.

The channel structures CH may be formed by anisotropically etching the sacrificial insulating layers 118 and the interlayer insulating layers 120, and may be formed by forming hole-shaped channel holes and filling the holes. Due to the height of the stack structure, sidewalls of the channel structures CH may not be perpendicular to the upper surface of the second substrate 101. The channel structures CH may be formed to be recessed into a portion of the second substrate 101. The channel structures CH may be formed by depositing at least a portion of the dielectric layer 142, the channel layer 140, the channel filling insulating layer 144, and the channel pad 145 in the channel holes in sequence.

The dielectric layer 142 may be formed to have a uniform thickness using an ALD or CVD process. In this process, an entirety or a portion of the dielectric layer 142 may be formed, and a portion extending perpendicularly to the second substrate 101 along the channel structures CH may be formed in this process. The channel layer 140 may be formed on the dielectric layer 142 in the channel structures CH. The channel filling insulating layer 144 may be formed to fill the channel structures CH, and may be an insulating material. The channel pad 145 may be formed of a conductive material, such as, for example, polycrystalline silicon.

Figure 10E:
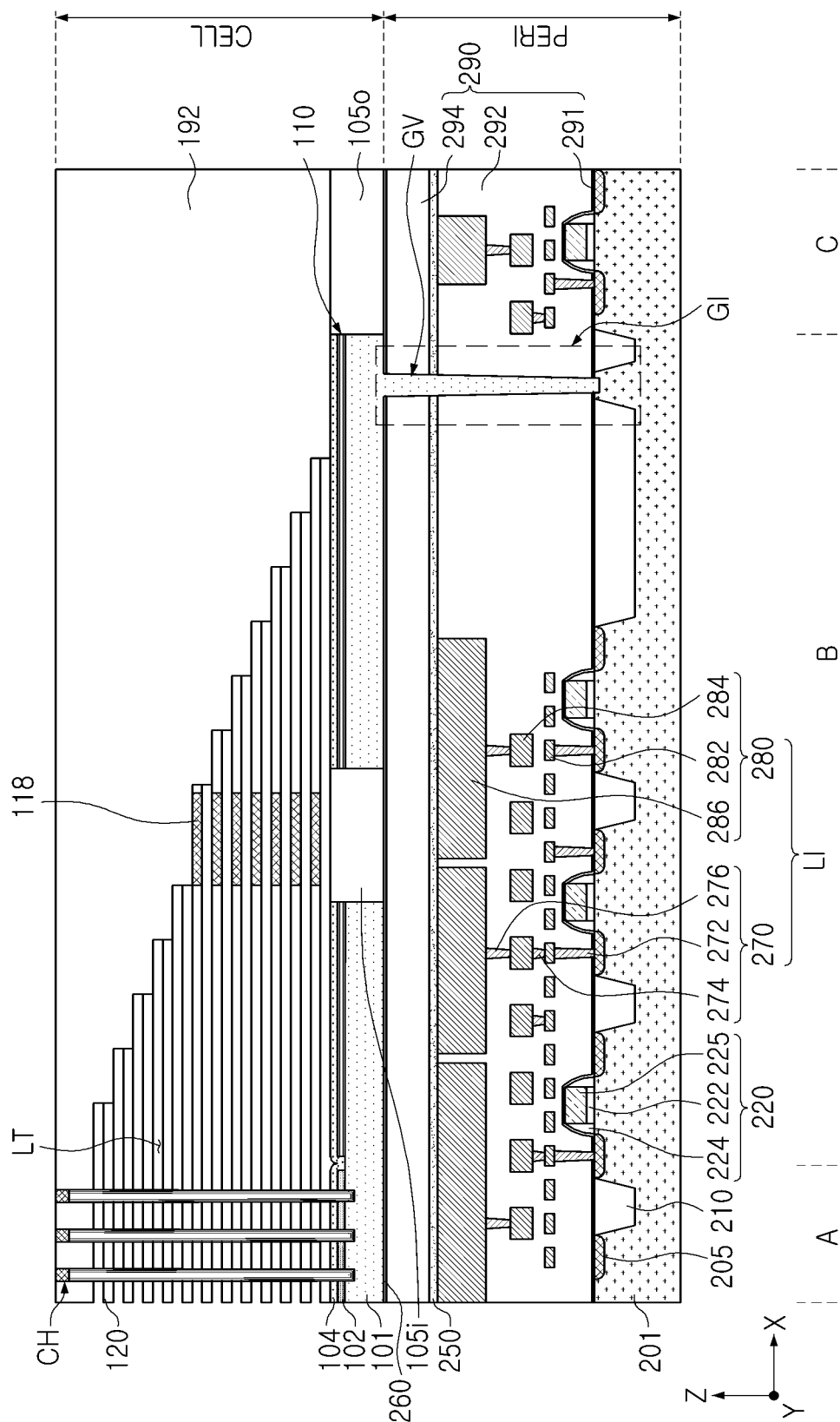

Referring to FIG. 10E, openings penetrating through the sacrificial insulating layers 118 and the interlayer insulating layers 120 may be formed in regions corresponding to the first and second isolation structures MS1 and MS2 (see FIG. 2B), and tunnel portions LT may be formed by removing a portion of the sacrificial insulating layers 118 through the openings.

First, sacrificial spacer layers may be formed in the openings, and the second horizontal insulating layer 112 may be exposed by an etch-back process. The second horizontal insulating layer 112 may be selectively removed, and the first horizontal insulating layers 111 may be removed. The first and second horizontal insulating layers 111 and 112 may be removed by, for example, a wet etching process. In the process of removing the first horizontal insulating layers 111, a portion of the dielectric layer 142 exposed in the region from which the second horizontal insulating layer 112 is removed may also be removed. The first horizontal conductive layer 102 may be formed by depositing a conductive material in the region from which the first and second horizontal insulating layers 111 and 112 are removed, and the sacrificial spacer layers may be removed from the openings.

In an example embodiment, the horizontal insulating layer 110 may be exposed by the opening on the first region A of the second substrate 101, or alternatively, the horizontal insulating layer 110 may not be exposed as the horizontal insulating layer 110 is spaced apart from the opening on the second region B. A second horizontal conductive layer 104 may fill the space above and between the first horizontal conductive layer 102 and the horizontal insulating layer 110. Accordingly, the horizontal insulating layer 110 may be replaced with the first horizontal conductive layer 102 on the first region A, and may remain on the second region B.

Thereafter, tunnel portions LT may be formed by removing the sacrificial insulating layers 118 exposed through the openings. The sacrificial insulating layers 118 may be selectively removed with respect to the interlayer insulating layers 120 using, for example, wet etching.

The sacrificial insulating layers 118 may be removed from an external side of the through-wiring region TR (see FIG. 2A), and the sacrificial insulating layers 118 may remain in the through-wiring region TR and may form an insulating region of the through-wiring region TR together with the interlayer insulating layers 120. The region in which the through-wiring region TR is formed may be spaced apart from the openings such that an etchant may not reach the region, and the sacrificial insulating layers 118 may remain. Accordingly, the through-wiring region TR may be formed in the center of the first and second isolation structures MS1 and MS2 between the first and second isolation structures MS1 and MS2 adjacent to each other.

Figure 10F:
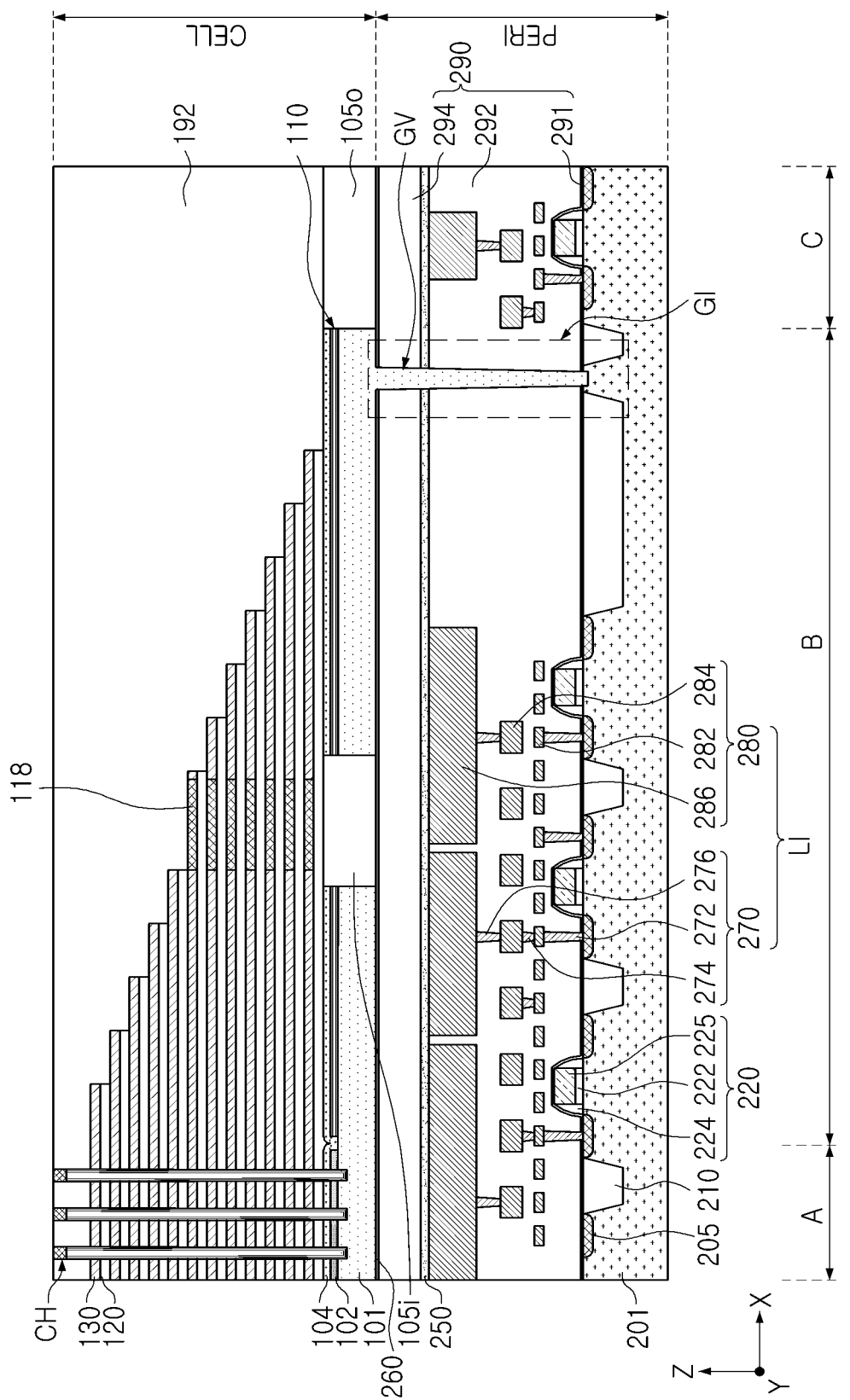

Referring to FIG. 10F, the gate electrodes 130 may be formed by filling the tunnel portions LT from which the sacrificial insulating layers 118 are partially removed with a conductive material.

The conductive material forming the gate electrodes 130 may fill the tunnel portions LT. The conductive material may include a metal, polycrystalline silicon, or a metal silicide material. After the gate electrodes 130 are formed, the isolation structures MS1 and MS2 (see FIG. 2B) may be formed by removing the conductive material deposited in the openings through an additional process, and filling an insulating material.

Figure 10G:
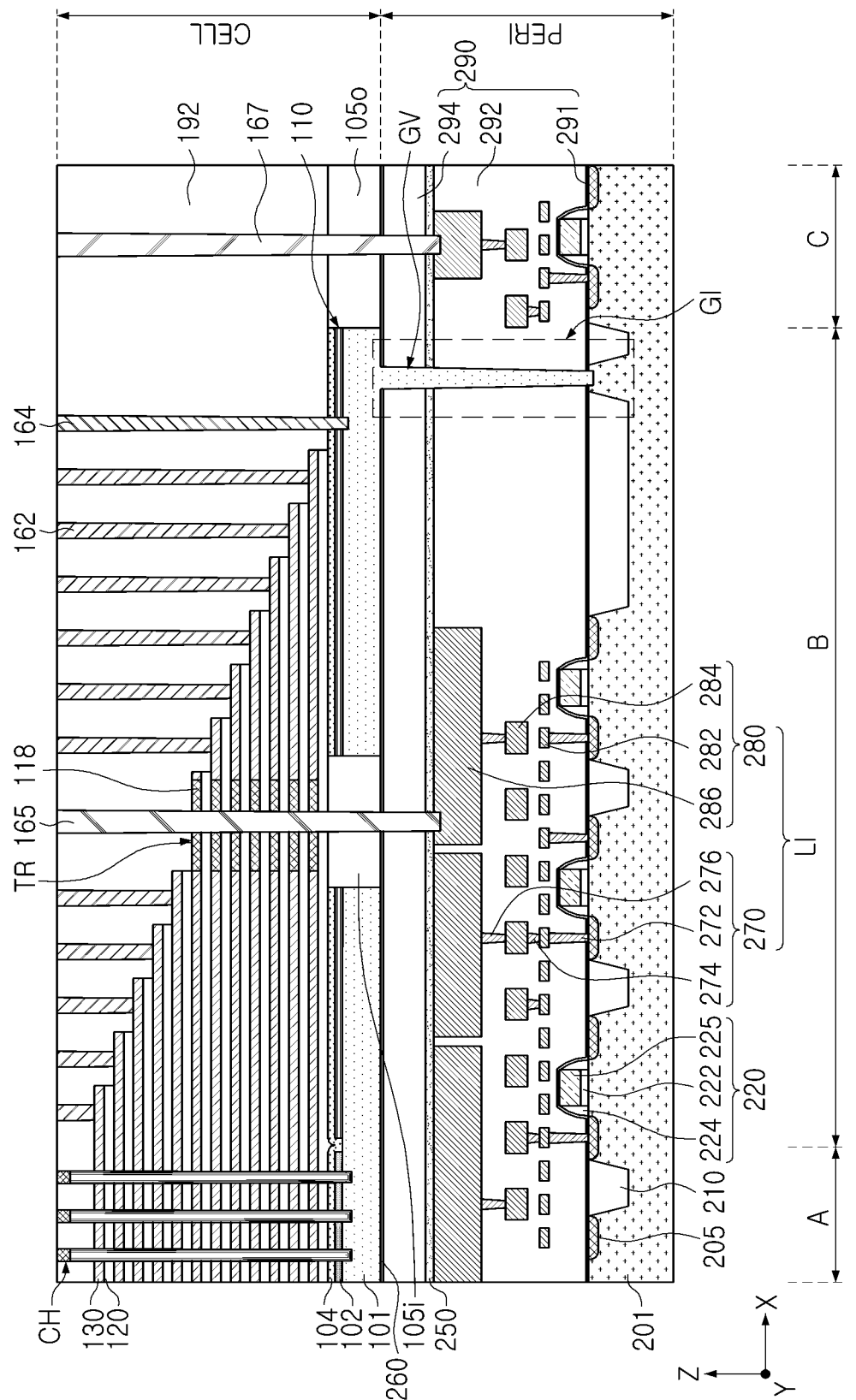

Referring to FIG. 10G, gate contacts 162 a substrate contact 164, and first and second through-vias 165 and 167, penetrating through the first cell region insulating layer 192, may be formed.

The gate contacts 162 may be formed to be connected to the gate electrodes 130 on the second region B, and the substrate contact 164 may be spaced apart from the gate electrodes 130 on the second region B and may be connected to the second substrate 101. The first through-via 165 may be connected to the lower wiring structure LI of the peripheral circuit structure PERI in the through-wiring region TR, and the second through-via 167 may be connected to the lower wiring structure LI of the peripheral circuit structure PERI in the external side region C.

The gate contacts 162, the substrate contact 164, and the first and second through-vias 165 and 167 may be formed to have different depths, and may be formed by simultaneously forming contact holes using an etch stop layer and filling the contact hole with a conductive material. However, in example embodiments, a portion of the gate contacts 162, the substrate contact 164, and the first and second through-vias 165 and 167 may be formed in different processes.

Thereafter, referring back to FIG. 2A, a second cell region insulating layer 194, an upper protective layer 195, and an upper wiring structure UI may be formed.

The upper contact plugs 170 of the upper wiring structure UI may be formed by partially forming the cell region insulating layer 190, removing a portion by etching, and filling the conductive material therein. The upper wiring lines 180 may be formed by, for example, depositing a conductive material and patterning the material.

A hydrogen passivation process may be performed on the upper wiring structure UI, the gate contacts 162, the substrate contact 164, or the first and second through-vias 165 and 167. The hydrogen passivation process may be a process for improving electrical properties of the upper wiring structure UI by addressing defects of the conductive material of the upper wiring structure UI. The hydrogen passivation process may include, for example, an annealing process using hydrogen or deuterium.

In an example embodiment, the hydrogen passivation process may be performed before forming the gate contacts 162 and the upper wiring structure UI, may be partially performed after forming the first upper wiring lines 182 and may be partially performed after forming the second upper wiring lines 184, or may be performed after forming the entirety of the upper wiring structures UI, but an example embodiment thereof is not limited thereto, and the process may be controlled to be performed in various ways.

As the number of the gate electrodes 130 increases or an aspect ratio of the gate contacts 162 increases, the amount of hydrogen or deuterium used in the hydrogen passivation process may increase.

As the diffusion barrier layer 260 includes a material having a relatively low hydrogen permeability, even when the amount of hydrogen or deuterium generated by the hydrogen passivation process increases, the diffusion barrier layer 260 may prevent hydrogen or deuterium from diffused to the peripheral circuit structure PERI. Accordingly, the issue in which the circuit devices 220 are defective due to hydrogen or deuterium may be addressed.

Accordingly, the semiconductor device 100 in FIGS. 1A to 2B which may have improved productivity and integration density may be manufactured.

Figure 11:
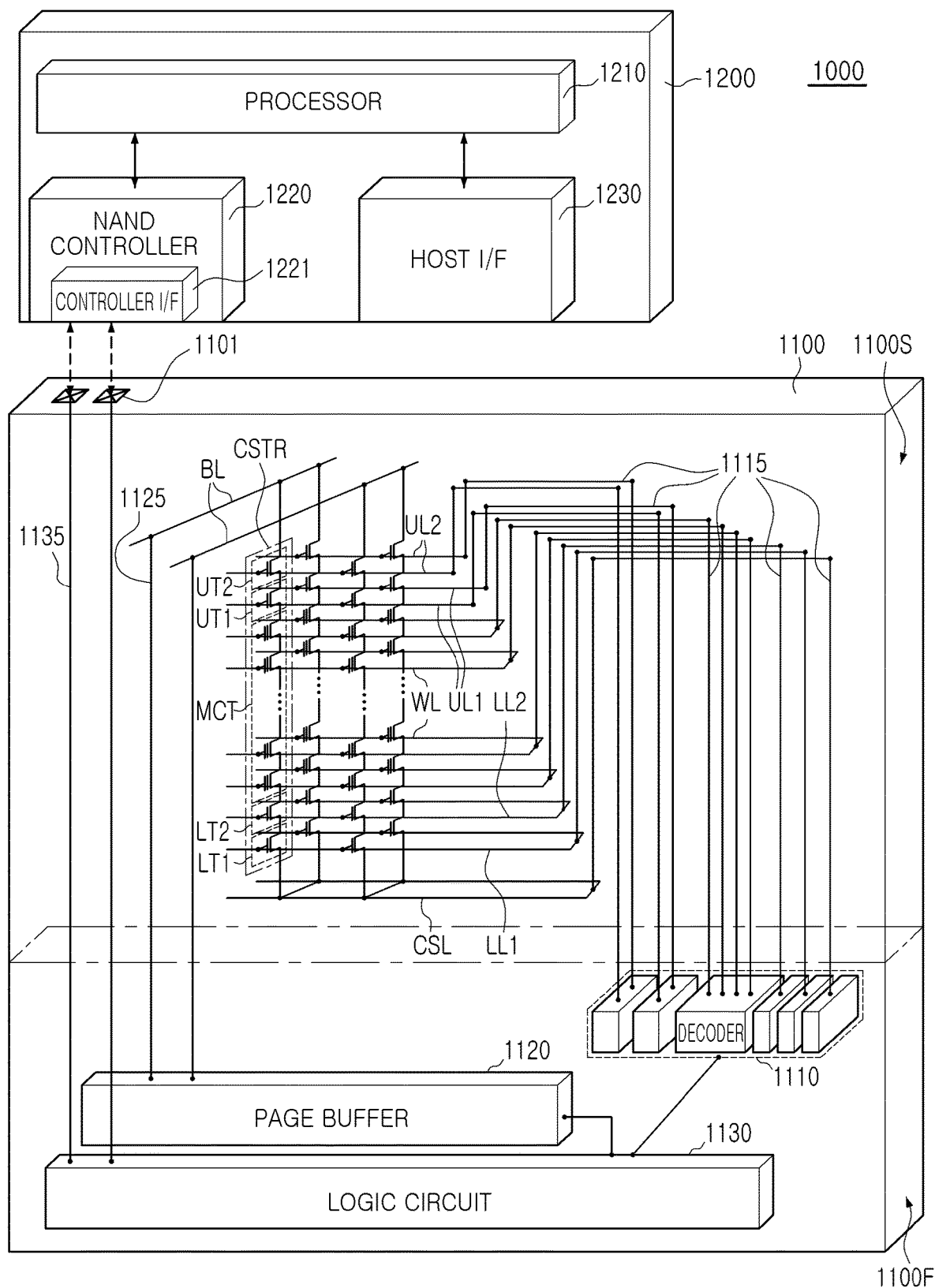
FIG. 11 is a diagram illustrating a data storage system including a semiconductor device according to an example embodiment of the present disclosure.

FIG. 11 is a diagram illustrating a data storage system including a semiconductor device according to an example embodiment.

Referring to FIG. 11, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device. In an example embodiment, the data storage system 1000 may be implemented as an electronic system storing data.

The semiconductor device 1100 may be implemented as a non-volatile memory device, such as, for example, the NAND flash memory device described above with reference to FIGS. 1 to 9. The semiconductor device 1100 may include a first structure 1100F and a second structure 1100S on the first structure 1100F. In example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wires 1115 extending from the first structure 1100F to the second structure 1100S. The bit lines BL may be electrically connected to the page buffer 1120 through second connection wires 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 processing communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command from an external host is received through the host interface 1230, the processor 1210 may control the semiconductor device 1100 in response to the control command.

Figure 12:
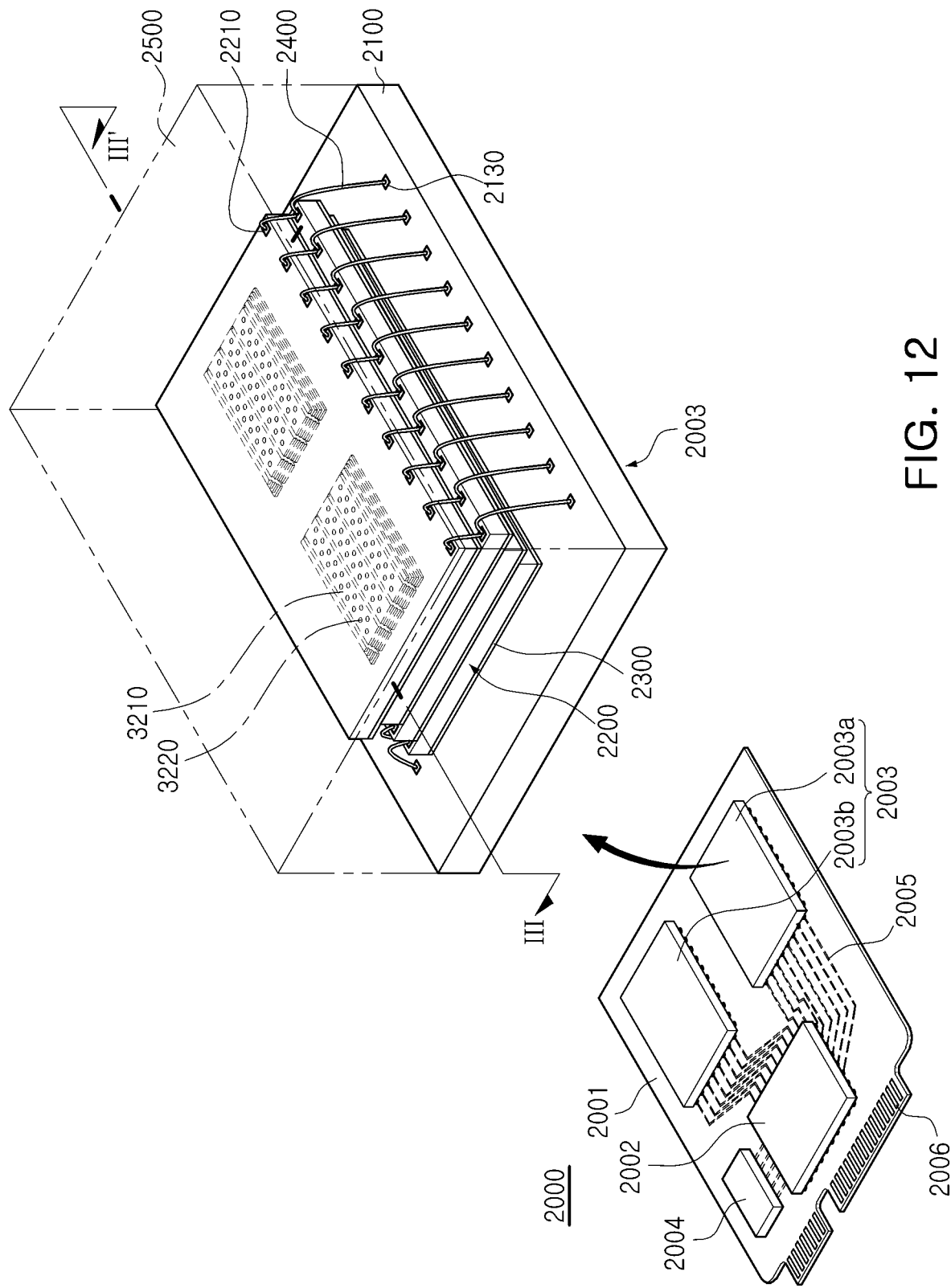
FIG. 12 is a perspective diagram illustrating a data storage system including a semiconductor device according to an example embodiment of the present disclosure and FIG. 13 is a cross-sectional diagram illustrating a semiconductor package according to an example embodiment of the present disclosure.

FIG. 12 is a perspective diagram illustrating a data storage system including a semiconductor device according to an example embodiment.

Referring to FIG. 12, a data storage system 2000 in an example embodiment may include a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with an external host according to one of interfaces from among universal serial bus (USB), peripheral component interconnect express (PCI-Express), serial advanced technology attachment (SATA), M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or may read data from the semiconductor package 2003, and may improve an operating speed of the data storage system 2000.

The DRAM 2004 may be configured as a buffer memory for alleviating a difference in speeds between the semiconductor package 2003, which is a data storage space, and an external host. The DRAM 2004 included in the data storage system 2000 may operate as a cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 11. Each of the semiconductor chips 2200 may include gate stack structures 3210 and channel structures 3220. Each of the semiconductor chips 2200 may include the semiconductor device described above with reference to FIGS. 1 to 9.

In example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (e.g., TSV) instead of the connection structure 2400 of a bonding wire method.

In example embodiments, the controller 2002 and the semiconductor chips 2200 may be included in a single package. In an example embodiment, the controller 2002 and the semiconductor chips 2200 may be mounted on a separate interposer substrate different from the main board 2001, and the controller 2002 and the semiconductor chips 2200 may be connected to each other wiring formed on the interposer substrate.

Figure 13:
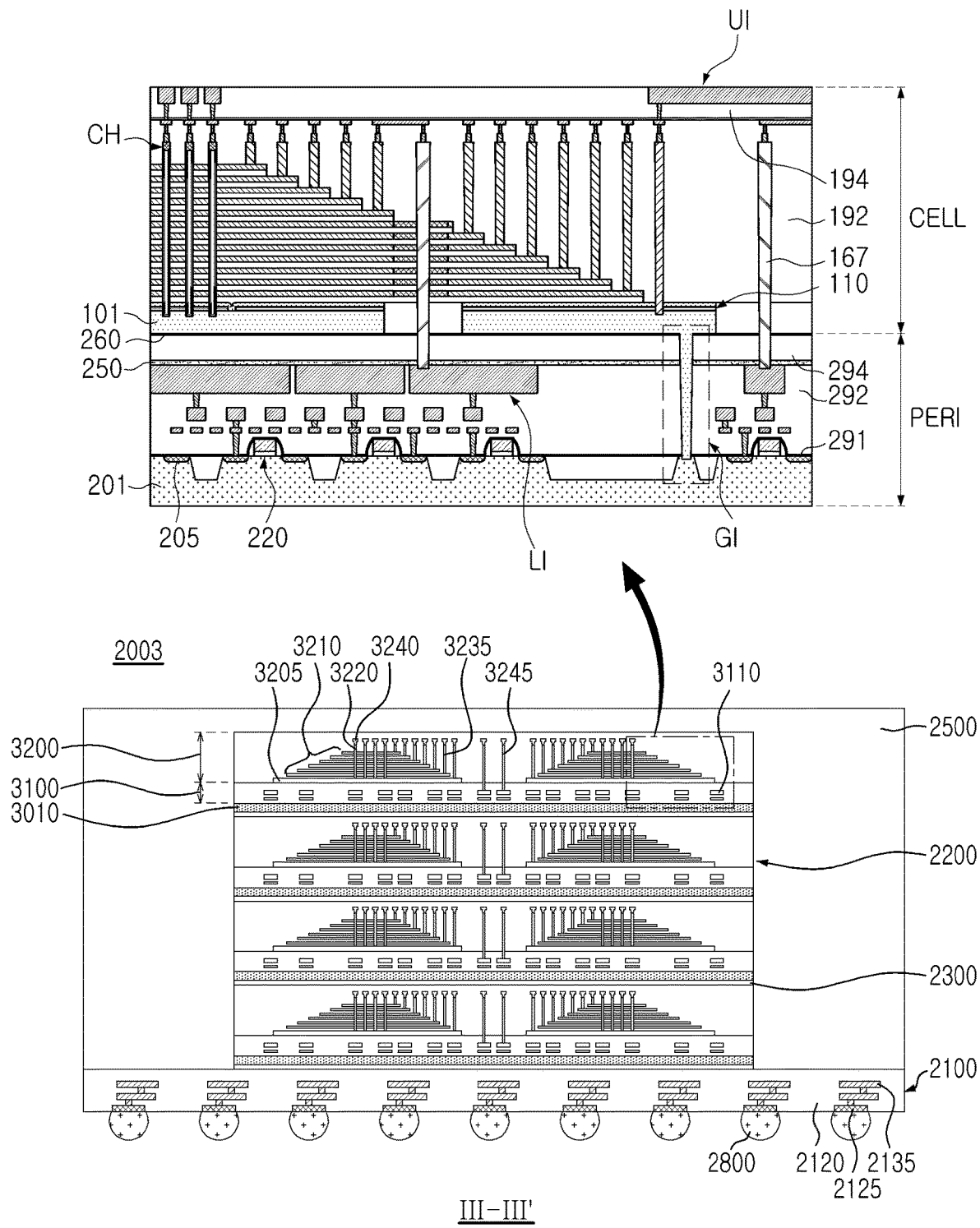

FIG. 13 is a cross-sectional diagram illustrating a semiconductor package according to an example embodiment, illustrating an example embodiment of the semiconductor package 2003 in FIG. 12 taken along line III-III'.

Referring to FIG. 13, in the semiconductor package 2003, the package substrate 2100 may be implemented as a printed circuit board. The package substrate 2100 may include a package substrate body 2120, package upper pads 2130 (see FIG. 12) disposed on the upper surface of the package substrate body 2120, package lower pads 2125 disposed on the lower surface of the package substrate body 2120 or exposed through the lower surface, and internal wirings 2135 electrically connecting the package upper pads 2130 to the package lower pads 2125 in the package substrate body 2120. The package upper pads 2130 may be electrically connected to the connection structures 2400 (see FIG. 12). The lower pads 2125 may be connected to the wiring patterns 2005 of the main board 2001 of the data storage system 2000 as illustrated in FIG. 12 through conductive connectors 2800.

Each of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 penetrating through the gate stack structure 3210 and isolation regions, bit lines 3240 electrically connected to the memory channel structures 3220, and gate contact plugs 3235 electrically connected to the word lines WL (see FIG. 11) of the gate stack structure 3210. As described above with reference to FIGS. 1 to 9, each of the semiconductor chips 2200 may further include a diffusion barrier layer 260 having a hydrogen permeability lower than that of silicon nitride between the lower wiring structure LI and the second substrate 101.

Each of the semiconductor chips 2200 may include a through wiring 3245 electrically connected to the peripheral wires 3110 of the first structure 3100 and extending into the second structure 3200. The through wiring 3245 may be disposed on an external side of the gate stack structure 3210, and may be further disposed to penetrate through the gate stack structure 3210. Each of the semiconductor chips 2200 may further include an input/output pad 2210 (see FIG. 12) electrically connected to the peripheral wirings 3110 of the first structure 3100.

According to the aforementioned example embodiments, by disposing a diffusion barrier layer having a hydrogen permeability lower than that of silicon nitride below the second substrate, a semiconductor device which may improve electrical properties of upper wiring structures by the hydrogen passivation process, may prevent the defects of the circuit devices by hydrogen discharged from the hydrogen passivation process, and may have improved productivity, and a data storage system including the same may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
 a peripheral circuit structure including a first substrate, circuit devices on the first substrate, a lower wiring structure electrically connected to the circuit devices, a lower insulating layer covering the lower wiring structure, and a diffusion barrier layer on the lower insulating layer; and a memory cell structure including a second substrate including first and second regions on the peripheral circuit structure, gate electrodes stacked and spaced apart from each other in a first direction perpendicular to an upper surface of the second substrate in the first region and extending in a second direction perpendicular to the first direction to form a staircase shape in the second region, and channel structures penetrating the gate electrodes in the first direction and each including a channel layer, wherein the diffusion barrier layer includes a first material layer having a hydrogen permeability lower than a hydrogen permeability of silicon nitride, and wherein the diffusion barrier layer is in contact with the lower insulating layer.

2. The semiconductor device of claim 1, wherein the diffusion barrier layer is spaced apart from the lower wiring structure in the first direction.

3. The semiconductor device of claim 1,
wherein the first material layer includes a two-dimensional material, polysilicon, or metal oxide, and
wherein the two-dimensional material includes graphene, hexagonal boron nitride (h-BN), black phosphorus, or transition metal di-chalcogenide (TMDC).

4. The semiconductor device of claim 3, wherein the first material layer includes two or more two-dimensional materials.

5. The semiconductor device of claim 3, wherein a thickness of the diffusion barrier layer is in a range of about 1 Å to about 200 Å.

6. The semiconductor device of claim 1, wherein the diffusion barrier layer further includes a second material layer on an upper surface of the first material layer and including a material different from that of the first material layer.

7. The semiconductor device of claim 6,
wherein the diffusion barrier layer further includes a third material layer on a lower surface of the first material layer and including a material different from that of the first material layer,
wherein the second material layer is between the first material layer and the second substrate, and
wherein the third material layer is between the first material layer and the lower insulating layer.

8. The semiconductor device of claim 7, wherein at least one of the second and third material layers includes silicon nitride.

9. The semiconductor device of claim 1,
wherein the lower insulating layer includes a first lower insulating layer having an upper surface coplanar with an upper surface of the lower wiring structure, and a second lower insulating layer covering the first lower insulating layer and the lower wiring structure,
wherein the peripheral circuit structure further includes a buffer layer between the lower wiring structure and the second lower insulating layer, and
wherein the diffusion barrier layer is on a vertical level higher than a vertical level of the buffer layer.

10. The semiconductor device of claim 9, wherein a first thickness of the diffusion barrier layer is smaller than a second thickness of the buffer layer.

11. The semiconductor device of claim 9, wherein the diffusion barrier layer includes a material having a hydrogen permeability lower than that of the buffer layer.

12. The semiconductor device of claim 1, further comprising:

a lower via extending from a lower surface of the second substrate and connected to the lower wiring structure,
wherein the lower via extends into the peripheral circuit structure and penetrates the diffusion barrier layer.

13. The semiconductor device of claim 1,
wherein the memory cell structure further includes:
an external substrate insulating layer adjacent the second substrate on an external side of the second substrate on the first substrate; and
a through-via penetrating the external substrate insulating layer and connected to the lower wiring structure,
wherein the diffusion barrier layer extends from a region between the lower insulating layer and the second substrate to a region between the lower insulating layer and the external substrate insulating layer.

14. The semiconductor device of claim 13, wherein the through-via penetrates the diffusion barrier layer and is connected to the lower wiring structure.

15. A semiconductor device, comprising:
a first substrate;
circuit devices on the first substrate;
a lower wiring structure electrically connected to the circuit devices;
a first lower insulating layer covering a side surface of the lower wiring structure;
a buffer layer covering the first lower insulating layer and the lower wiring structure;
a second lower insulating layer on the buffer layer;
a diffusion barrier layer on the second lower insulating layer;
a second substrate including first and second regions on the diffusion barrier layer;
gate electrodes stacked and spaced apart from each other in a first direction perpendicular to an upper surface of the second substrate in the first region and extending in a second direction perpendicular to the first direction at various lengths to form a staircase shape in the second region; and
channel structures penetrating the gate electrodes in the first direction and each including a channel layer,
wherein the diffusion barrier layer includes a first material layer which is a two-dimensional material layer, and
wherein the diffusion barrier layer is in contact with the second lower insulating layer.

16. The semiconductor device of claim 15, wherein a hydrogen permeability of the first material layer is less than about $7.4 \times 10^{12}/m^2s$ (at 1 nm, 1 bar).

17. The semiconductor device of claim 15,
wherein the buffer layer includes silicon nitride, and
wherein the first material layer has a thickness smaller than that of the buffer layer.

18. The semiconductor device of claim 15, wherein the diffusion barrier layer further includes a second material layer in contact with the first material layer and including the same material as that of the buffer layer.

19. A data storage system, comprising:
a semiconductor storage device including: a peripheral circuit structure including a first substrate, circuit devices on the first substrate, a lower wiring structure electrically connected to the circuit devices, a lower insulating layer covering the lower wiring structure, and a diffusion barrier layer on the lower insulating layer; and a memory cell structure including a second substrate including first and second regions on the peripheral circuit structure, gate electrodes stacked and spaced apart from each other in a first direction perpendicular to an upper surface of the second substrate in the first region and extending in a second direction perpendicular to the first direction to form a staircase shape in the second region, and channel structures penetrating the gate electrodes in the first direction and each including a channel layer, and an input/output pad electrically connected to the circuit devices; and a controller electrically connected to the semiconductor storage device through the input/output pad and configured to control the semiconductor storage device, wherein the diffusion barrier layer includes a first material layer having a hydrogen permeability lower than a hydrogen permeability of silicon nitride, and wherein the diffusion barrier layer is in contact with the lower insulating layer.

20. The data storage system of claim 19, wherein the first material layer includes at least one two-dimensional material.

* * * * *